United States Patent [19]
Hamamoto et al.

[11] Patent Number: 5,910,927
[45] Date of Patent: Jun. 8, 1999

[54] MEMORY DEVICE AND SENSE AMPLIFIER CONTROL DEVICE

[75] Inventors: Takeshi Hamamoto; Masaki Tsukude, both of Tokyo, Japan

[73] Assignee: Mitsubishi Denki Kabushiki Kaisha, Tokyo, Japan

[21] Appl. No.: 08/931,525

[22] Filed: Sep. 16, 1997

[30] Foreign Application Priority Data

Apr. 11, 1997 [JP] Japan ..................................... 9-93676

[51] Int. Cl.$^6$ ............................................. G11C 8/00
[52] U.S. Cl. ............................. 365/230.03; 365/230.02; 365/230.08; 365/205; 365/185.05
[58] Field of Search ..................... 365/185.05, 230.02, 365/230.03, 230.06, 205, 230.08

[56] References Cited

U.S. PATENT DOCUMENTS

| | | | |
|---|---|---|---|
| 4,685,088 | 8/1987 | Iannucci | 365/230.08 |
| 4,825,410 | 4/1989 | Lee | 365/241 |
| 5,007,024 | 4/1991 | Tanaka et al. | 365/203 |
| 5,479,374 | 12/1995 | Kobayashi et al. | 365/203 |
| 5,495,454 | 2/1996 | Fukuzo | 365/230.08 |
| 5,553,026 | 9/1996 | Nakai et al. | 365/230.03 |
| 5,555,523 | 9/1996 | Haga et al. | 365/205 |
| 5,636,174 | 6/1997 | Rao | 365/230.03 |
| 5,748,553 | 5/1998 | Kitamura | 365/230.03 |

OTHER PUBLICATIONS

Yasuhiko Nitta, et al., "A 1.6 GB/s Data-Rate 1Gb Synchronous DRAM With Hierarchical Square-Shaped Memory Block and Distributed Bank Architecture", ISSCC Digest of Technical Papers, IEEE (1996) pp. 376-377.

Jei-Hwan Yoo, et al., "A 32-Bank 1Gb DRAM With 1GB/s Bandwidth ", ISSCC Digest of Technical Papers, IEEE (1996) pp. 378-379.

*Primary Examiner*—David Nelms
*Assistant Examiner*—Tuan T. Nguyen
*Attorney, Agent, or Firm*—Oblon, Spivak, McClelland, Maier & Neustadt, P.C.

[57] ABSTRACT

A memory device having a smaller circuit area but efficiently used is provided. A plurality of main word lines (MWL) extending in a row direction are connected through respective bank latches (BL) to a single global word line (GWL) extending across banks (BANK0, BANK1). Selective activation of an enable signal (BLE) and the global word line (GWL) selects one of the bank latches (BL) to selectively activate an associated main word line (MWL). This state is held by the selected bank latch (BL) after the enable signal (BLE) is inactivated. Then, another enable signal (BLE) is activated to selectively activate another main word line (MWL). Sub-decoders (SD) connected to the main word lines (MWL) are selected independently of each other to independently activate word lines (WL) for each bank (BANK).

12 Claims, 27 Drawing Sheets

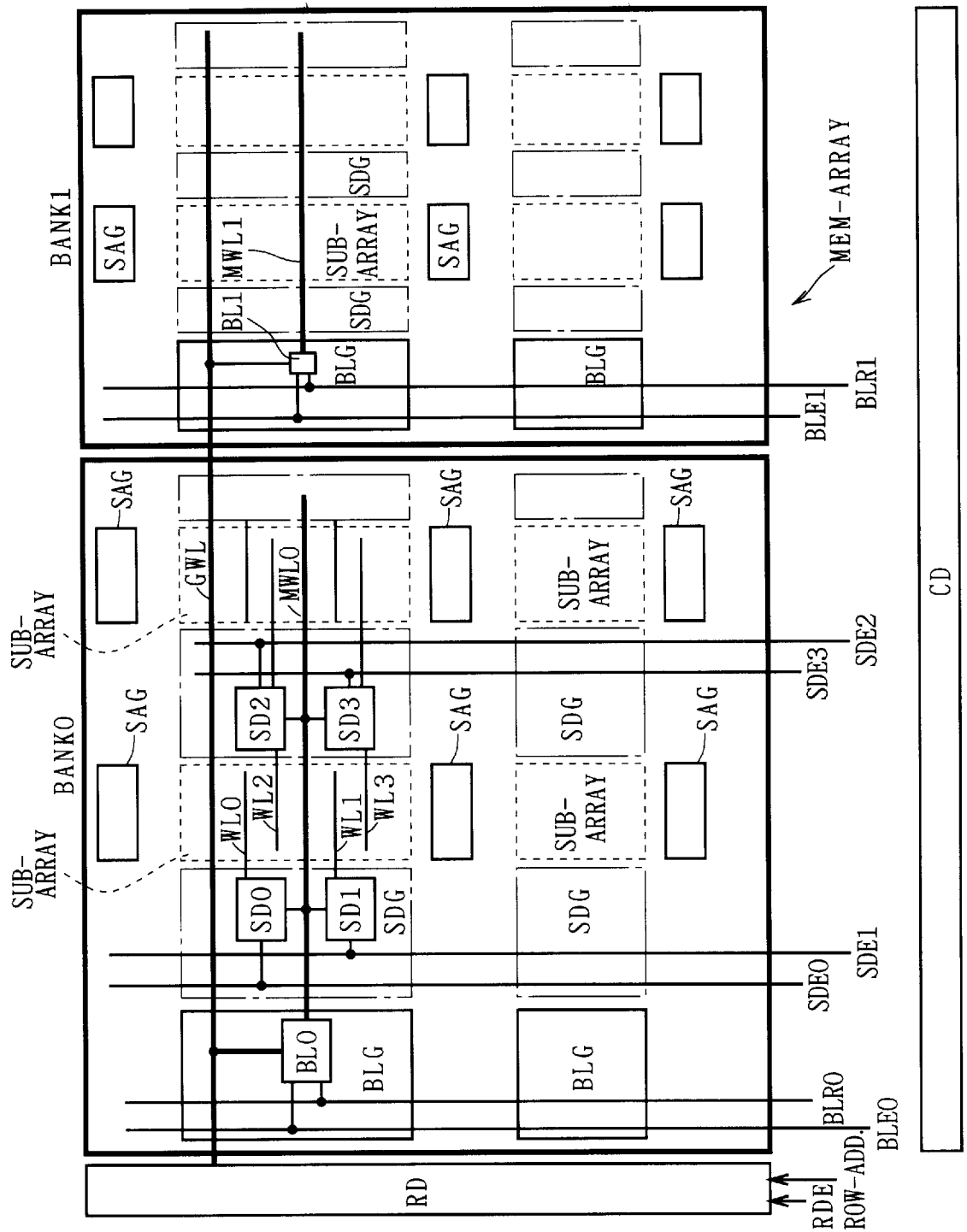
F I G. 1

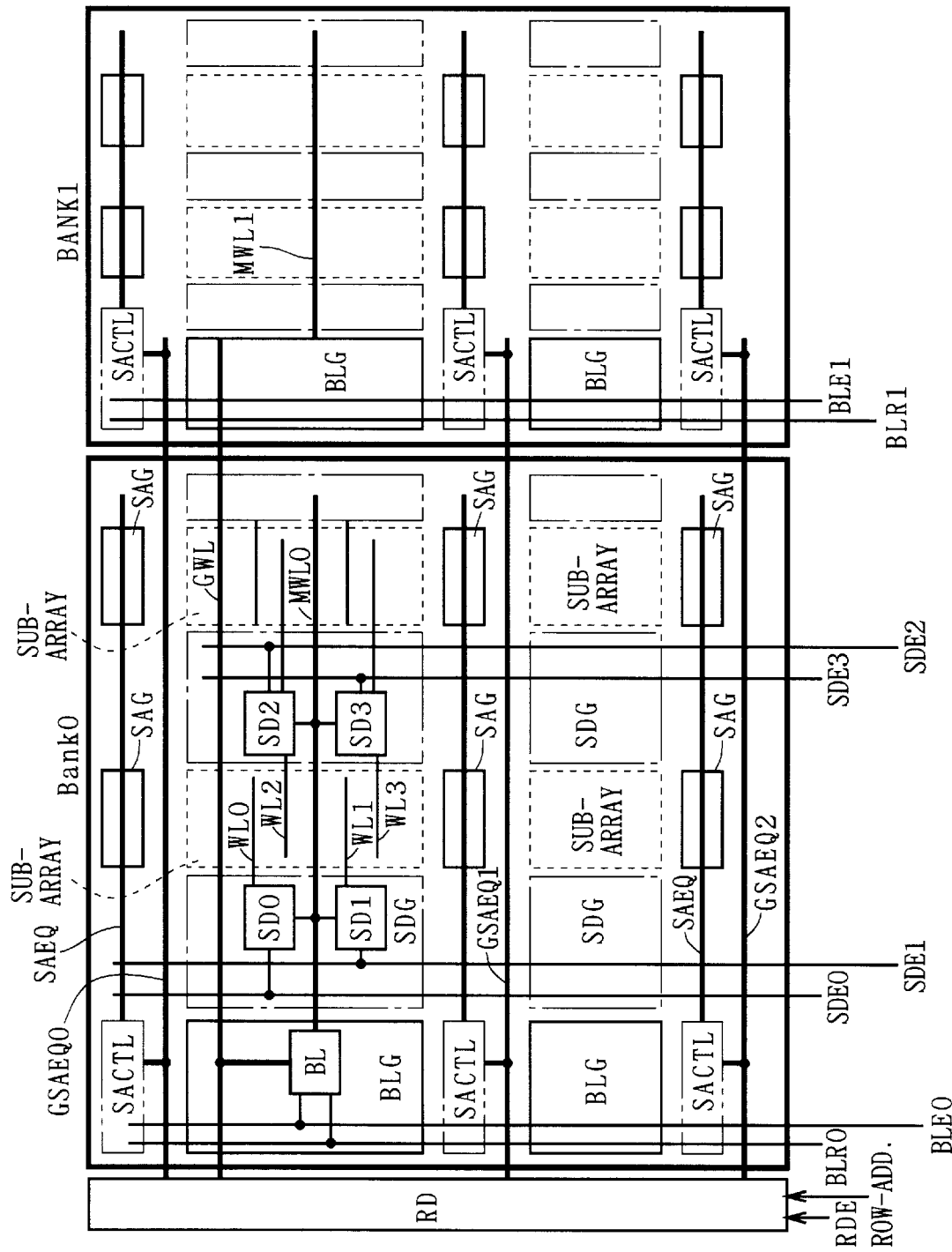
F I G. 27

F I G. 3 0
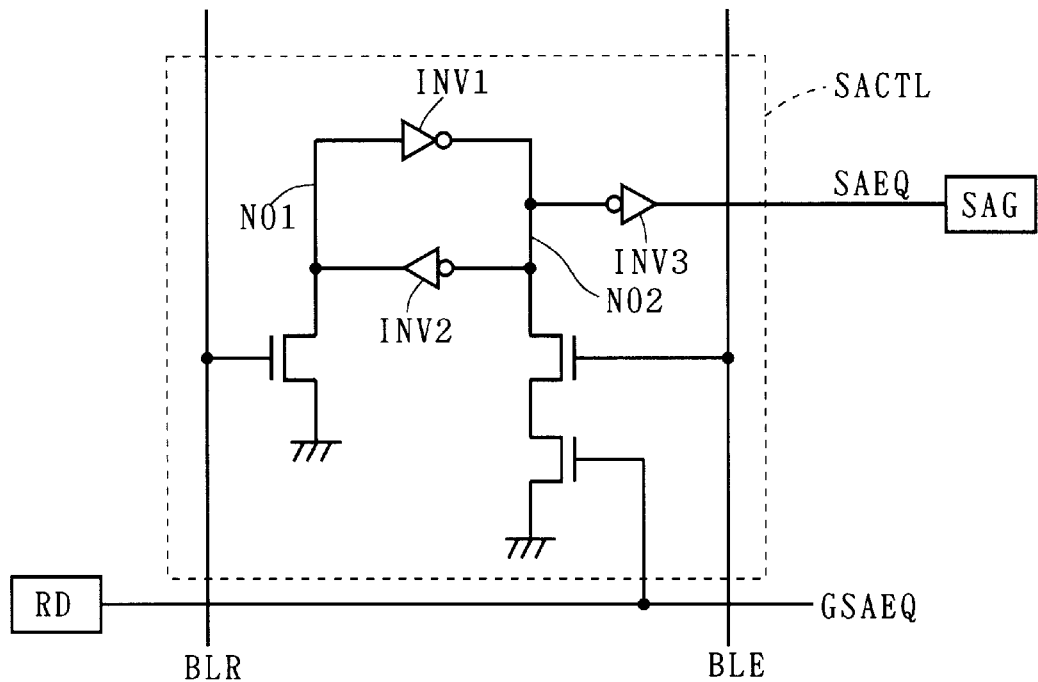
F I G. 3 1
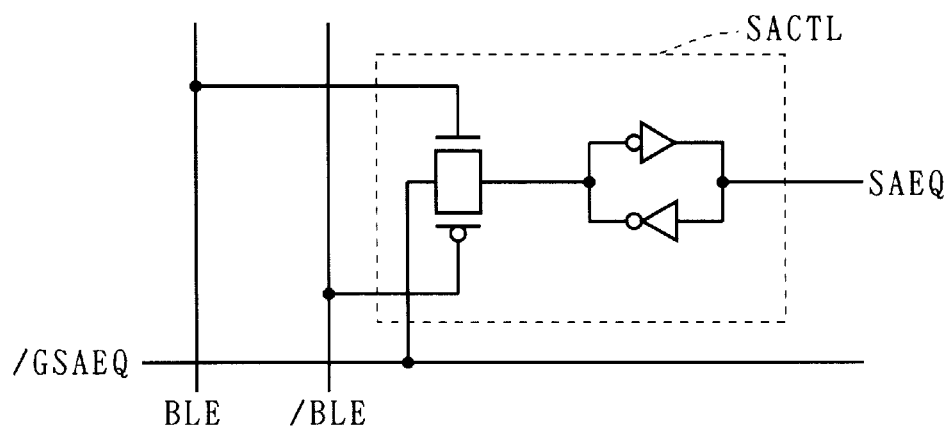

MEMORY DEVICE AND SENSE AMPLIFIER CONTROL DEVICE

BACKGROUND OF THE INVENTION

1. Field of the Invention

The present invention relates to a memory device having a bank architecture, and a sense amplifier control device used for the memory device.

2. Description of the Background Art

FIG. 36 is a circuit diagram of a background art RAM (DRAM or SDRAM). A memory array (mem-array) is meant to define a range of elements decoded by one column decoder and one row decoder. One bank corresponds to one memory array. One bank BANK100 is illustrated in FIG. 36 as decoded by one row decoder RD and one column decoder CD.

An architecture for controlling a plurality of banks is described with reference to FIG. 37. FIG. 37 is a circuit diagram of a background art circuit architecture for controlling different banks independently. The use of the banks is advantageous in that the RAM is efficiently utilized by independent control for each bank.

A device receives a row-address and a bank-address. Row bank selectors select the row-address in accordance with the bank-address to hold and output the selected row-address as a local row-address. As a result, only the local row-address selected depending upon the bank-address is activated, and the row decoder RD corresponding to the selected local row-address (for example, the row decoder of the bank BANK100) is activated. The row decoder RD selects a main word line MWL to hold the state wherein the main word line MWL is selected.

The function of the plurality of row bank selectors to independently hold the local row-addresses permits independent control of the plurality of banks. Specifically, a circuit operation to be described below may be performed. First, the bank-address selects the bank BANK100 and the row-address activates one main word line MWL. Then, the bank-address and the row-address are successively provided in this state to activate the main word line of a bank BANK110. Since the row bank selectors independently hold the row-addresses, the successively provided local row-addresses may differ from each other.

After the selection of the main word line, a column-address and the bank-address are applied to the device. Column bank selectors select the column-address in accordance with the bank-address to output the selected column-address as a local column-address. As a result, only the local column-address selected depending upon the bank-address is activated, and the column decoder CD of, for example, the bank BANK100 is accordingly activated to select a column selection line CSL.

The above described architecture is subjected to various restrictions in dividing one memory array into the plurality of banks to efficiently use the RAM. The restrictions are described hereinafter on the assumption that the bank BANK100 is divided by the dotted line of FIG. 37 into two new banks arranged in the column direction.

The activation of the main word line and retention of this state must be performed independently for each of the banks resulting from the division. It is hence necessary to provide a row decoder for holding the local row-address in each of the banks resulting from the division. The provision of the row decoder in each of the banks adds to the circuit area.

The bank division presents a problem in association with the amplification of data of memory cells included in the RAM. As illustrated in FIG. 36, data read from a memory cell MC onto data lines DL are amplified by a pair of sense amplifier groups SAG disposed in the column direction on opposite sides of a sub-array containing the memory cell MC. More specifically, each of the sense amplifier groups SAG comprises a plurality of sense amplifiers SA for amplifying data. Both of the pair of sense amplifier groups SAG on opposite sides of one sub-array are involved in the amplification of the data in the sub-array. The amplified data are held in the sense amplifiers SA.

When the bank BANK100 is divided by the dotted line of FIG. 36, two sub-arrays on opposite sides of each sense amplifier group SAG lying in a boundary part of the divided banks can be activated simultaneously. For example, it is assumed that both main word lines MWL1 and MWL2 are activated. Based on the above described data amplification mechanism, the sense amplifier groups SAG on opposite sides of the sub-arrays in which the main word lines MWL1 and MWL2 are present are to be involved in the amplification. Then, each sense amplifier group SAG in the boundary part must simultaneously amplify the data of two sub-arrays to sacrifice the data of one of the sub-arrays.

To solve the above described problem, an architecture has been used wherein the sense amplifier groups SAG are doubled in the boundary part. FIG. 38 is a circuit diagram of a RAM which comprises row decoders RD100, RD101, and sense amplifier groups SAG arranged so that some of the sense amplifier groups SAG which lie in the boundary part are provided pairwise.

The row decoders RD100 and RD101 are provided in corresponding relation to two banks BANK100 and BANK101 formed by dividing the bank BANK100 of FIG. 36. The row bank selectors of FIG. 37 (not shown in FIG. 38) are provided for independently controlling the row decoders RD100 and RD101. The row bank selectors independently apply the local row-addresses to the row decoders RD100 and RD101. The sense amplifier groups SAG provided pairwise in the boundary part permit the individual data amplification in the banks BANK100 and BANK101.

Such an architecture allows independent selection and retention of main word lines MWL0 and MWL1 having different row-addresses in each of the banks into which one memory array is divided.

The pairwise formation of the sense amplifiers SAG in the boundary part, however, increases the number of sense amplifier groups SAG as the number of banks into which the memory array is divided increases, resulting in the increase in the layout area of the memory array.

SUMMARY OF THE INVENTION

According to a first aspect of the present invention, a memory device comprises: a first-stage word line selected in response to a row-address applied to a row decoder; a plurality of latch circuits commonly connected to the first-stage word line and acting independently of each other; second-stage word lines connected respectively to the plurality of latch circuits and activated independently of each other; and third-stage word lines selectively activated by sub-decoders connected to the second-stage word lines.

Preferably, according to a second aspect of the present invention, in the memory device of the first aspect, the first-stage word line includes a plurality of first-stage word lines; the plurality of latch circuits are divided into groups arranged in a row direction with the second-stage word lines used as units; and the plurality of latch circuits hold data in response to a holding signal, the holding signal being independent for each of the groups and common within each of the groups.

Preferably, according to a third aspect of the present invention, in the memory device of the second aspect, the plurality of latch circuits are reset in response to a reset signal, the reset signal being independent for each of the groups and common within each of the groups.

Preferably, according to a fourth aspect of the present invention, in the memory device of the second aspect, the plurality of latch circuits are reset in response to a reset signal for providing a "reset" instruction upon switch-on or reset.

Preferably, according to a fifth aspect of the present invention, in the memory device of the second aspect, the first-stage and second-stage word lines are comprised of the same metal interconnect layer.

Preferably, according to a sixth aspect of the present invention, in the memory device of the first aspect, the first-stage word line includes a plurality of first-stage word lines; the plurality of latch circuits are divided into groups arranged in a row direction with the second-stage word lines used as units and are divided into blocks arranged in a column direction; and a holding signal for instructing the plurality of latch circuits to hold data is activated independently for each of the groups and the blocks.

Preferably, according to a seventh aspect of the present invention, in the memory device of the first aspect, the plurality of latch circuits are arranged in parallel as viewed in the row direction and commonly connected to the first-stage word line.

Preferably, according to an eighth aspect of the present invention, in the memory device of the second aspect, data stored in a memory cell specified by the row-address is amplified by a sense amplifier, and the memory device further comprises a sense amplifier control circuit for controlling the sense amplifier, the sense amplifier control circuit comprising: a switching portion for changing a conducting/non-conducting state of a first sense amplifier control enable signal in response to the holding signal; and a latch portion for holding a logic of the first sense amplifier control enable signal provided thereto through the switching portion, the latch portion having a first output terminal for providing a first sense amplifier control signal for controlling the sense amplifier.

Preferably, according to a ninth aspect of the present invention, in the memory device of the eighth aspect, the latch portion has a second output terminal for outputting a signal in response to the logic of the first sense amplifier control enable signal held therein; and the sense amplifier control circuit comprises a gate element for determining whether a second sense amplifier control signal to be outputted therefrom is active or inactive in response to a second sense amplifier control enable signal applied thereto and the signal from the second output terminal of the latch portion.

According to a tenth aspect of the present invention, a sense amplifier control device comprises: a switching portion for changing a conducting/non-conducting state of a first sense amplifier control enable signal in response to a switching signal; and a latch portion for holding a logic of the first sense amplifier control enable signal provided thereto through the switching portion, the latch portion having a first output terminal for providing a first sense amplifier control signal for controlling a sense amplifier for amplifying memory cell data.

Preferably, according to an eleventh aspect of the present invention, in the sense amplifier control device of the tenth aspect, the latch portion has a second output terminal for outputting a signal in response to the logic of the first sense amplifier control enable signal held therein, and the sense amplifier control device further comprises: a gate element for determining whether a second sense amplifier control signal to be outputted therefrom is active or inactive in response to a second sense amplifier control enable signal applied thereto and the signal from the second output terminal of the latch portion.

In accordance with the first aspect of the present invention, a memory array is divided into a plurality of banks arranged in the row direction with the second-stage word lines used as units. This is accomplished by the latch circuits for independently latching the selection states of the second-stage word lines. It is only necessary to provide a plurality of individual second-stage word line and latch circuit pairs for the first-stage word line. This allows the efficient use of the memory device without significant increase in circuit area.

In accordance with the second aspect of the present invention, one of the plurality of latch circuits is selectively activated by selectively activating the first-stage word lines and the holding signals. The holding signal is only required to be commonly provided within each group. This facilitates the generation of the holding signal and reduces the unnecessary circuit area.

In accordance with the third aspect of the present invention, like the second aspect, the plurality of latch circuits are reset for each group. The circuit area required for generation of the reset signal is reduced.

In accordance with the fourth aspect of the present invention, the latch circuits are reset without exception upon switch-on, permitting the stable operation of the memory device after switch-on.

In accordance with the fifth aspect of the present invention, the number of steps of fabrication of the memory device may be reduced. The three-stage word line structure for achieving the division of the memory array into the plurality of banks requires the conventional number of fabrication steps for word line formation.

In accordance with the sixth aspect of the present invention, the plurality of latch circuits are activated in response to the holding signal according to the group and the block. The structure of the sixth aspect has fewer latch circuits to be activated than the structure of the second aspect, reducing the load on the holding signal and increasing the operating speed of the memory device.

In accordance with the seventh aspect of the present invention, a plurality of second-stage word lines correspond to the single first-stage word line in the column direction. This reduces the number of first-stage word lines to alleviate the pitch thereof.

In accordance with the eighth and tenth aspects of the present invention, the sense amplifiers may be independently controlled in the individual banks after division. In particular, in the structure of the eighth aspect, the switching portion is switched in response to the holding signal, and the sense amplifier control device controls the sense amplifier in synchronism with the latch circuits.

In accordance with the ninth and eleventh aspects of the present invention, the switching portion and the latch portion are used to generate both the first and second sense amplifier control signals different from each other. This reduces the circuit area.

It is therefore an object of the present invention to provide a memory device having a smaller circuit area but efficiently used, and a sense amplifier control device used for the memory device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 2 are circuit diagrams of an architecture of a memory device according to a first preferred embodiment of the present invention;

FIG. 27 is a circuit diagram of an architecture of the memory device according to a ninth preferred embodiment of the present invention;

FIG. 30 is a circuit diagram of a second example of the architecture of the memory device according to the ninth preferred embodiment of the present invention;

FIG. 31 is a circuit diagram of a third example of the architecture of the memory device according to the ninth preferred embodiment of the present invention;

DESCRIPTION OF THE PREFERRED EMBODIMENTS

First Preferred Embodiment

Figure 2:
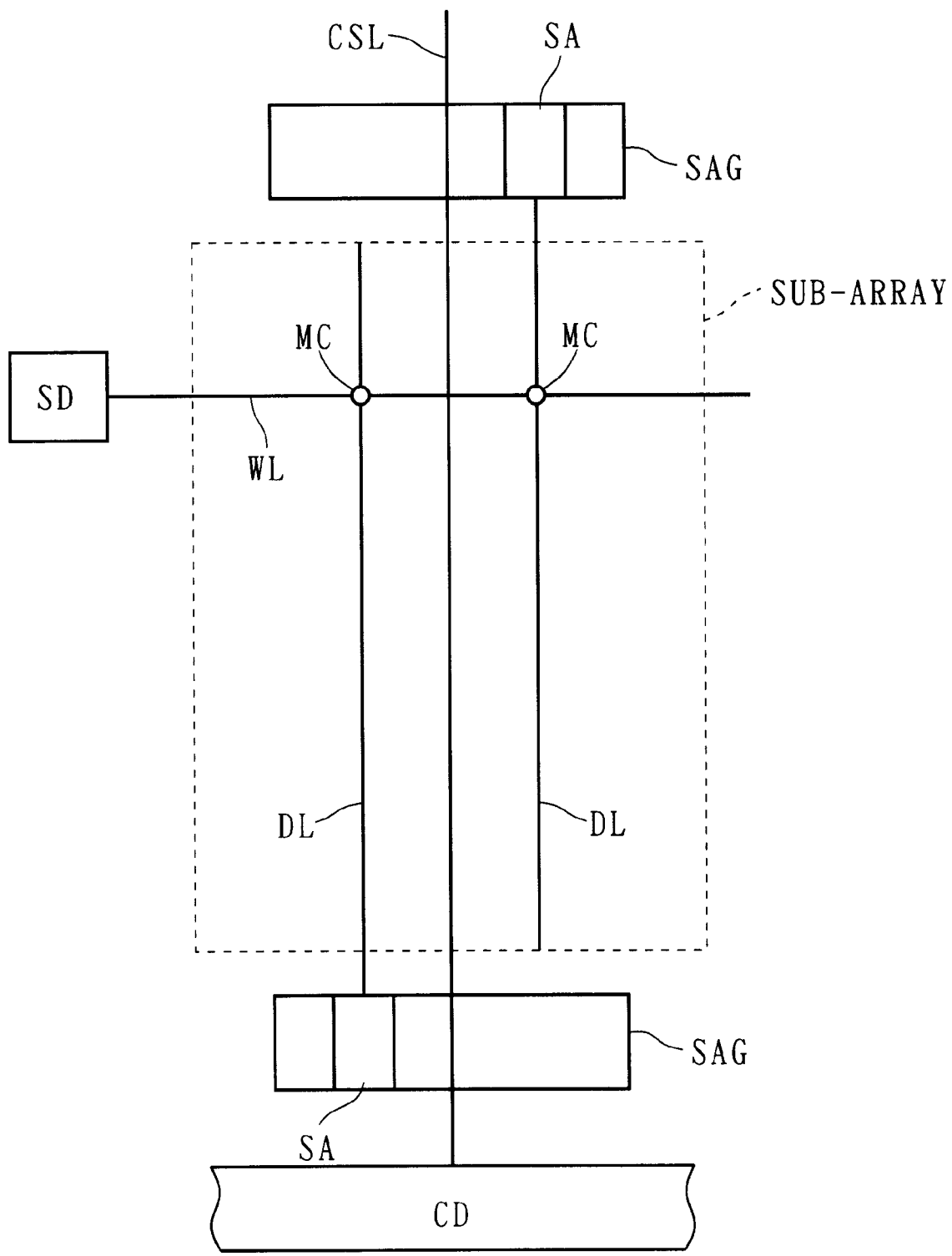

In preferred embodiments, like reference numerals and characters are used to designate elements identical with those of the background art. For purposes of simplification, numeric characters following the reference characters are dispensed with as required so that the reference characters followed by no numeric characters generically designate elements for reference. For example, a plurality of banks BANK0 and BANK1 are generically referred to as a bank BANK.

When the numeric characters following the reference characters correspond to each other, characters such as "n" and "m" are used to generally indicate the corresponding relation as required. For example, a combination of a bank latch BL0 and a bank latch enable signal BLE0 and a combination of a bank latch BL1 and a bank latch enable signal BLE1 are represented as a bank latch BLn and a bank latch enable signal BLEn.

FIG. 1 is a circuit diagram of an architecture of a RAM according to a first preferred embodiment of the present invention. A memory array controlled by one row decoder RD and one column decoder CD is divided into two banks BANK0 and BANK1 arranged in the row direction. Each of the banks BANK0 and BANK1 comprises bank latch groups BLG, sub-decoder groups SDG, sub-arrays, and sense amplifier groups SAG.

The row decoder RD is provided with a plurality of global word lines GWL extending in the row direction across the banks BANK0 and BANK1. Only one global word line GWL is shown in FIG. 1. Each of the bank latch groups BLG includes a plurality of bank latches BL. The global word lines GWL are provided in one-to-one correspondence with groups of bank latches BL arranged in the row direction. Each of the global word lines GWL is commonly connected to all of the bank latches BL included in the corresponding group. In other words, the plurality of bank latches BL are connected to any one of the global word lines GWL. In one bank BANK, however, only the single bank latch BL connected to that global word line GWL is provided.

Figure 37:
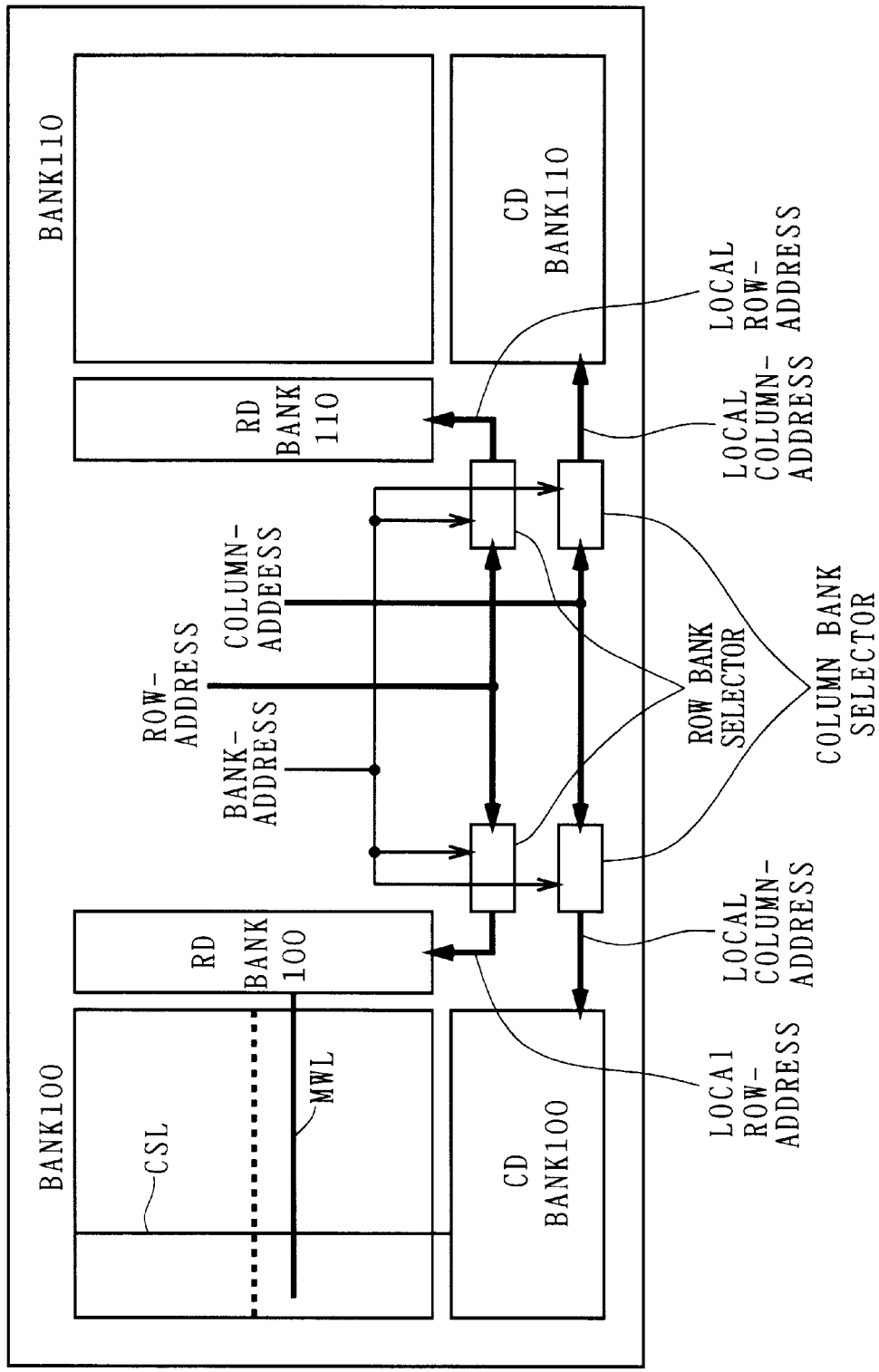

The row decoder RD is activated in response to a row-address similar to the conventional row-address of FIG. 37 and a novel row decoder enable signal RDE according to the present invention to select one of the plurality of global word lines GWL.

The bank latch BL receives a bank latch enable signal BLE and a bank latch reset signal BLR. The bank latch enable signal BLE and the bank latch reset signal BLR are produced for each bank BANK. The bank latch enable signal BLEn and the bank latch reset signal BLRn are commonly connected to all of the bank latches BL included in the bank BANKn.

In the above described arrangement, the bank latch BL receives the bank latch enable signal BLE, the bank latch reset signal BLR, and a signal from the global word line GWL. One of the global word lines GWL is selectively activated by the row decoder RD and one of the bank latch enable signals BLE is selectively activated, whereby one of the bank latches BL included in one memory array is selectively activated.

For example, when the global word line GWL shown in FIG. 1 and a bank latch enable signal BLE0 are activated, a bank latch BL0 shown as included in the bank BANK0 is activated. A main word line MWL0 connected to the bank latch BL0 is accordingly selected. The bank latch BLn has the function of continuously holding its state until the bank latch reset signal BLRn is activated. So, the bank latch BL0 holds the state in which the main word line MWL0 is selected.

On the other hand, when the global word line GWL shown in FIG. 1 and a bank latch enable signal BLE1 are activated, a bank latch BL1 shown as included in the bank BANK1 is activated. Then, a main word line MWL1 is selected.

The activation of the bank latch BL1 after the activation of the bank latch BL0 is described below as an example. The main word line MWL0 is selected by the first activation of the bank latch BL0 of FIG. 1. The bank latch BL0 functions to hold the state in which the main word line MWL0 is selected after the global word line GWL and the bank latch enable signal BLE0 are inactivated.

The main word line MWL is connected to a plurality of sub-decoders SD in the sub-decoder group SDG. Only the sub-decoders SD0 to SD3 connected to the main word line MWL0 are shown in FIG. 1. The sub-decoder SDm is selectively activated in response to a signal from the main word line MWL connected thereto and a sub-decoder enable signal SDEm on the basis of principles similar to those of the selective activation of the bank latch BL. Then, one of the word lines WLm in the sub-array which is connected to the selectively activated sub-decoder SD is selected. For example, a word line WL0 is selected when the main word line MWL0 and a sub-decoder enable signal SDE0 are active, and a word line WL1 is selected when the main word line MWL0 and a sub-decoder enable signal SDE1 are active.

With the state in which the main word line MWL0 is selected being held, the global word line GWL shown in FIG. 1 and the bank latch enable signal BLE1 are activated to activate the main word line MWL1. Thereafter, the sub-decoder SD and the word line WL are selected in the sub-decoder group SDG and the sub-array within the bank BANK1 in a manner similar to the selection in the bank BANK0.

In this state, the word line WL1 in the bank BANK0 and one word line not shown in the bank BANK1 are active at the same time. That is, the plurality of word lines WL are simultaneously active within one memory array. The RAM may be said to be efficiently used.

In the above description, the main word lines MWL connected to the same global word line GWL are successively activated. However, a different global word line GWL may be successively activated to activate different main word lines MWL.

For canceling the state in which the main word lines MWL in the bank BANKn are selected, the bank latch reset signal BLRn is activated to simultaneously reset all of the bank latches BL included in the bank BANKn.

In summary, the plurality of main word lines MWL extending in the row direction are connected to the single global word line GWL through the respective bank latches BL. The bank latches BL independently receiving the bank latch enable signal BLE and the bank latch reset signal BLR independently select the respective main word lines MWL to hold and cancel the state in which the main word lines MWL are selected. That is, one memory array is divided into the plurality of banks BANK arranged in the row direction with the main word lines MWL used as units which are independently activated in the row direction. The plurality of sub-decoders SD connected commonly to the single main word line MWL are selectively activated by the sub-decoder enable signal SDE.

Based on the above described arrangement, the bank latches BL and the sub-decoders SD are selectively activated to selectively activate the plurality of word lines WL independently for each word bank BANK after the division. That is, the plurality of word lines WL may be activated simultaneously in the single memory array.

FIG. 2 is a detailed circuit diagram of the sub-array, the sense amplifier groups SAG, and the column decoder CD, and illustrates parts of the circuit of FIG. 1 in detail. The circuit of FIG. 2 is similar in construction to the conventional circuit. The sub-array includes memory cells MC arranged in a matrix in the row direction and in the column direction. More specifically, each of the memory cells MC is connected at the intersection of the word line WL connected to the sub-decoder SD and a data line DL connected to a sense amplifier group SAG comprised of a plurality of sense amplifiers SA.

The sub-array is located in a region surrounded by the sub-decoder groups SDG and the sense amplifier groups SAG. The data read to the data line DL by the activation of the word line WL are amplified and held by the plurality of sense amplifiers SA included in the pair of sense amplifier groups SAG on opposite sides of the sub-array.

A plurality of column selection lines CSL are connected to the column decoder CD, and one of the column selection lines CSL is selectively activated in response to a column-address. Each of the column selection lines CSL is connected to one of the sense amplifiers SA in the sense amplifier group SAG to output the data held in the connected sense amplifier SA to the exterior.

When one memory array is divided into the plurality of banks BANK in which the word lines WL are simultaneously active as illustrated in FIG. 1, the data in the memory cells MC shown in FIG. 2 are read, amplified, and held in the plurality of sub-arrays. The held data should be successively read by the column decoder CD. The RAM is efficiently used, and the processing speed is improved.

Figure 3:
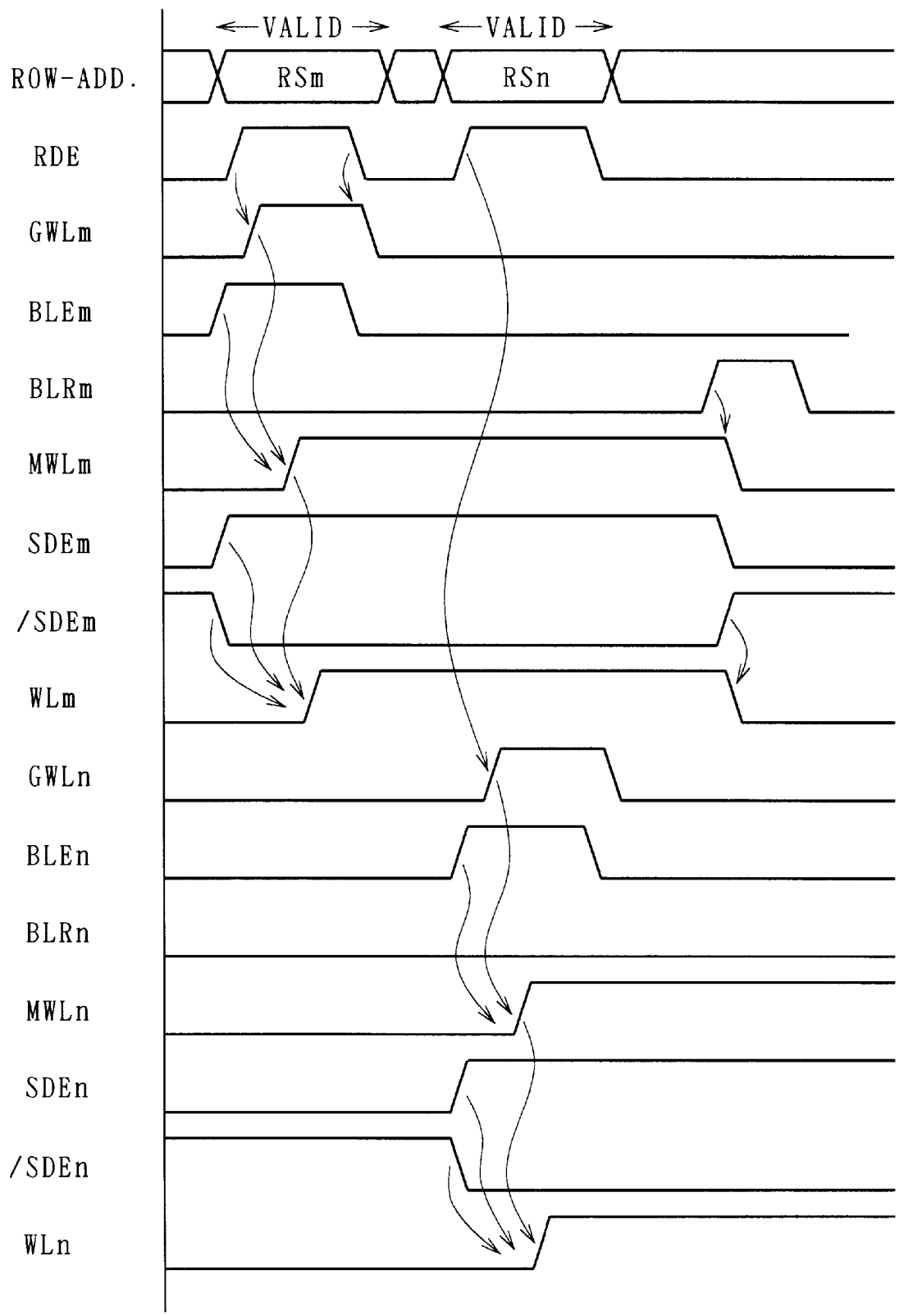
FIG. 3 shows waveforms of a timing chart of the memory device according to the first preferred embodiment of the present invention.

FIG. 3 is a waveform chart illustrating changes in general signals for simultaneously activating the word lines in the plurality of banks into which the memory array is divided. The characters "m" and "n" are added for reference to different memory cells MC. For example, "GWLm" represents the global word line which must be activated to read data from the memory cell which is referred to by "m". The arrows of FIG. 3 indicate which signal causes the signal change.

First, the row decoder enable signal RDE is activated while the row-address is valid. The row decoder RD accordingly selects and activates a required one (GWLm) of the global word lines GWL.

The bank latch BLm is activated by the activation of both the row decoder enable signal RDE and the bank latch enable signal BLEm. The main word line MWLm connected to the activated bank latch BLm is selectively activated.

At the same time that the bank latch enable signal BLEm is activated, the sub-decoder enable signal SDEm, and a sub-decoder enable signal /SDEm which is the inverse of the sub-decoder enable signal SDEm, are activated. The symbol "/" preceding a reference character indicates that the signal designated by the reference character is inverted. The sub-decoder enable signal SDEm is active high, and the sub-decoder enable signal /SDEm is active low.

The sub-decoder SDm at the intersection of the selected main word line MWLm and the sub-decoder enable signal SDEm selects and activates the word line WLm. Even if the row decoder enable signal RDE and the bank latch enable signal BLEm are inactivated after the activation of the word line WLm and the row-address is made invalid, the main word line MWLm and the word line WLm are continuously held active.

Then, similar signal operation is performed while the row-address specifying the memory cell referred to by "n" is valid. The main word line MWLn and the word line WLn are selected and activated independently of the main word line MWLm and the like. In this manner, the simultaneous selection and activation of a combination of the main word line MWLm and word line WLm and a combination of the main word line MWLn and word line MLn are achieved.

For canceling the state in which the main word line MWLm and word line WLm are selected and active, the bank latch reset signal BLRm is activated and the sub-decoder enable signal SDEm and the sub-decoder enable signal /SDEm are inactivated. The same is true for the main word line MWLn and the word line WLn.

In the first preferred embodiment, the plurality of main word lines with the respective bank latches extend in the row direction and are connected commonly to the global word line. Such an architecture permits the single memory array to be divided into the banks arranged in the row direction and controlled independently, achieving the efficient use of the RAM. There is no need to provide the additional sense amplifiers which have been required in the boundary part resulting from the division of the memory array, suppressing the increase in circuit area due to the division.

The step of forming the new global word lines which is additionally provided increases the number of steps of fabrication of the RAM. However, when the main word lines and the global word lines are formed as the metal interconnect lines in the same layer, the increase in the number of fabrication steps is suppressed, and the number of steps of forming the various word lines is equal to that of the background art.

Second Preferred Embodiment

Figure 4:
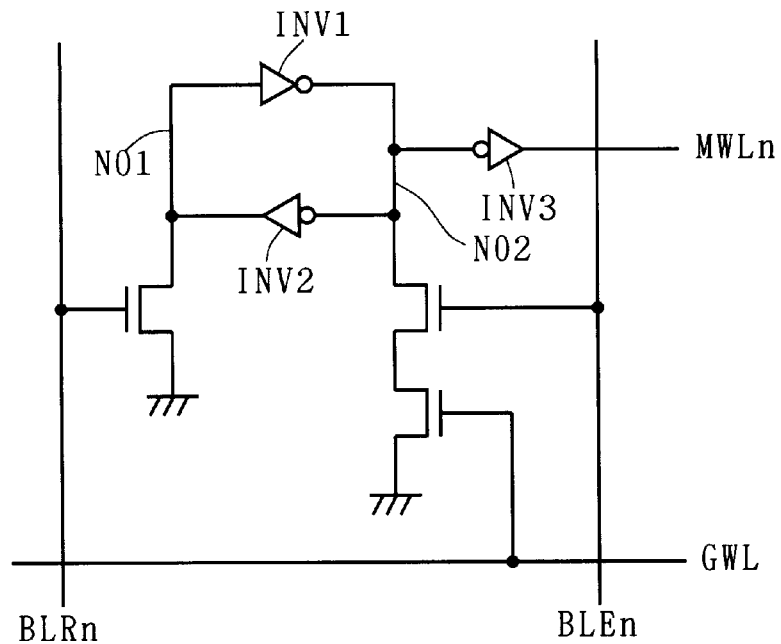
FIGS. 4 and 5 are circuit diagrams of a first example of an architecture of the memory device according to a second preferred embodiment of the present invention.
Figure 5:
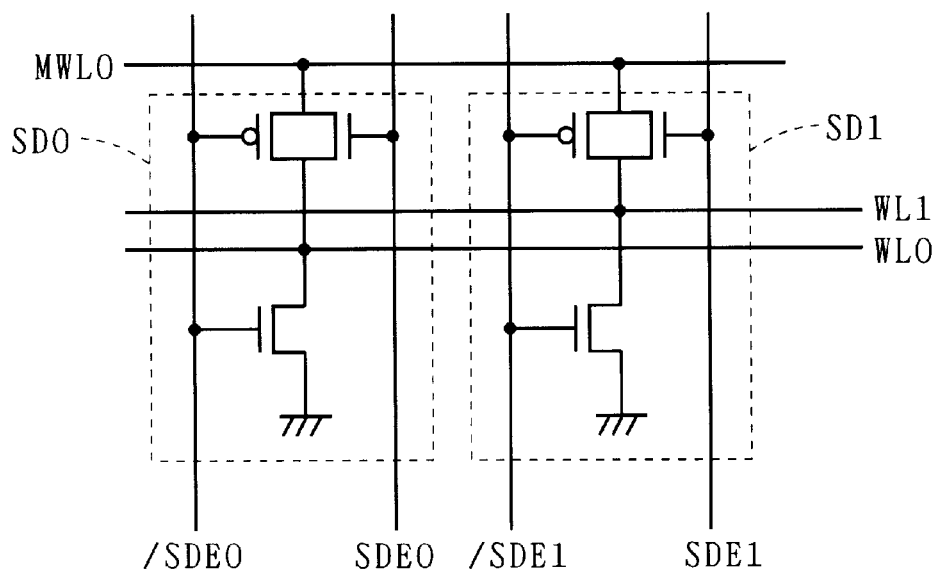

The structures of the bank latch BL and the sub-decoder SD are described in a second preferred embodiment according to the present invention. Like reference characters are used to designate elements identical with those described above, and the description of these elements is dispensed with. FIGS. 4 and 5 are circuit diagrams of the bank latch BL and the sub-decoder SD shown in FIG. 1, respectively.

With reference to FIG. 4, inverters INV1 and INV2 are connected in a loop such that the input terminal of one of the inverters INV1 and 1NV2 is connected to the output terminal of the other to form a latch. A node NO1 connected to the input terminal of the inverter INV1 is grounded through source and drain electrodes of a MOS transistor, the conduction of which is controlled by the bank latch reset signal BLRn.

A node NO2 connected to the output terminal of the inverter INV1 is grounded through in-series connected source and drain electrodes of two MOS transistors. The conduction of these two MOS transistors is controlled by the bank latch enable signal BLEn and the signal from the global word line GWL, respectively. An inverter INV3 having an input terminal connected to the node NO2 drives the data held in the latch to determine whether the main word line MWLn is active or inactive.

In the above described arrangement, when both the signal from the global word line GWL and the bank latch enable signal BLEn are "H", the latch is set and the potential at the node NO2 is the ground potential ("L"). Then, the logics of the node NO1 and the main word line MWLn are "H".

When the bank latch reset signal BLRn is "H", the node NO1 is "L" and the node NO2 is "H". Then, the latch is reset to change the logic of the main word line MWLn to "L". The generation of the bank latch reset signal BLR and the bank latch enable signal BLE will be described later in a third preferred embodiment.

The bank latch BL shown in FIG. 4 is advantageous in that the global word line GWL and the main word line MWLn may operate with different amplitudes. In other words, the global word line GWL may operate with a voltage Vcc while the main word line MWLn operates with a voltage Vpp (Vpp>Vcc).

Another advantage of the bank latch BL shown in FIG. 4 is that the global word line GWL and the main word line MWLn are both active high. Since the global word line GWL and the main word line MWLn are "L" in stand-by state, a leakage current resulting from a short-circuit is prevented if the short-circuit occurs between the global word line GWL and the main word line MWLn in the memory array.

The sub-decoders SD0 and SD1 shown in FIG. 1 are discussed with reference to FIG. 5. Other sub-decoders are similar in construction to the sub-decoders SD0 and SD1. The construction of the sub-decoders of the second preferred embodiment is similar to that of the background art. Thus, the sub-decoder enable signals SDE and /SDE may be produced from the conventional circuits in a conventional manner.

The single sub-decoder SDm includes a transmission gate comprised of an NMOS transistor, the conduction of which is controlled by the sub-decoder enable signal SDEm, and a PMOS transistor, the conduction of which is controlled by the sub-decoder enable signal /SDEm. The sub-decoder SDm further includes an NMOS transistor, the conduction of which is controlled by the sub-decoder enable signal /SDEm. The transmission gate and the NMOS transistor selectively apply the potential of the main word line MWU) and the ground potential to the word line WLm.

Specifically, the word line WL0 is asserted high when the main word line MWL) is "H", the sub-decoder enable signal SDE() is "H" and the sub-decoder enable signal /SDE0 is "L". The same is true for the word line WL1.

Figure 6:
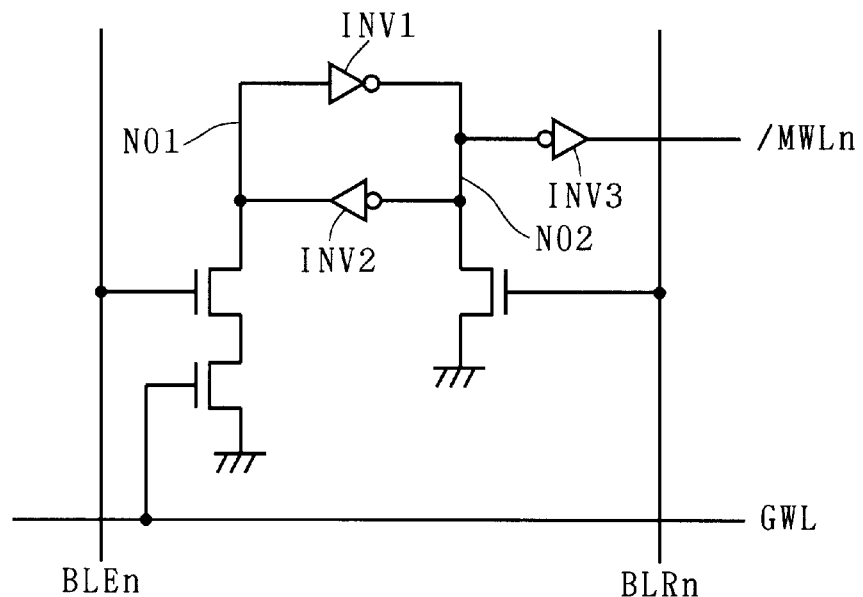
FIGS. 6 through 8 are circuit diagrams of a second example of the architecture of the memory device according to the second preferred embodiment of the present invention.
Figure 7:
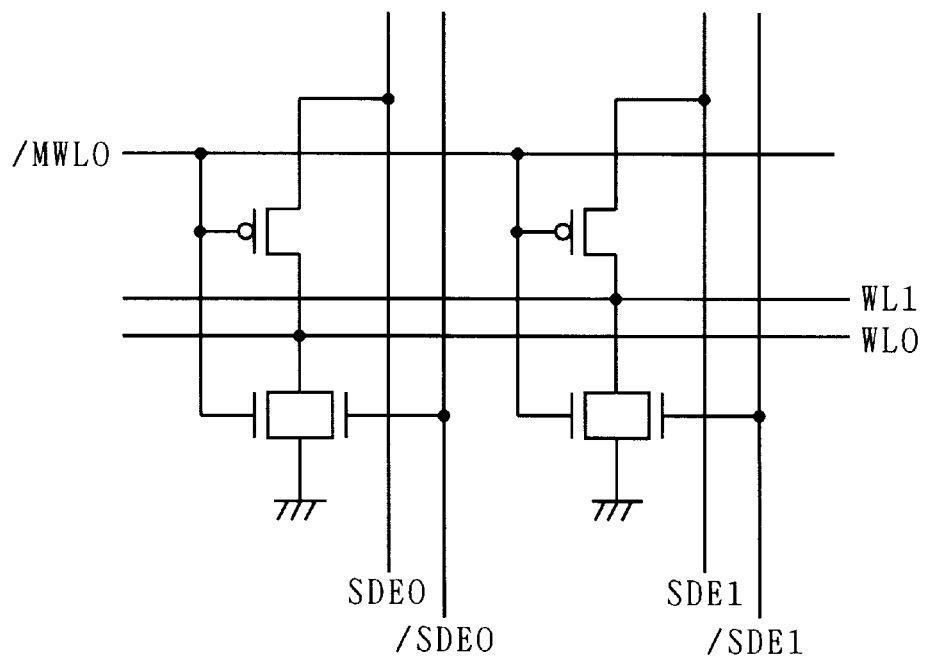
Figure 8:
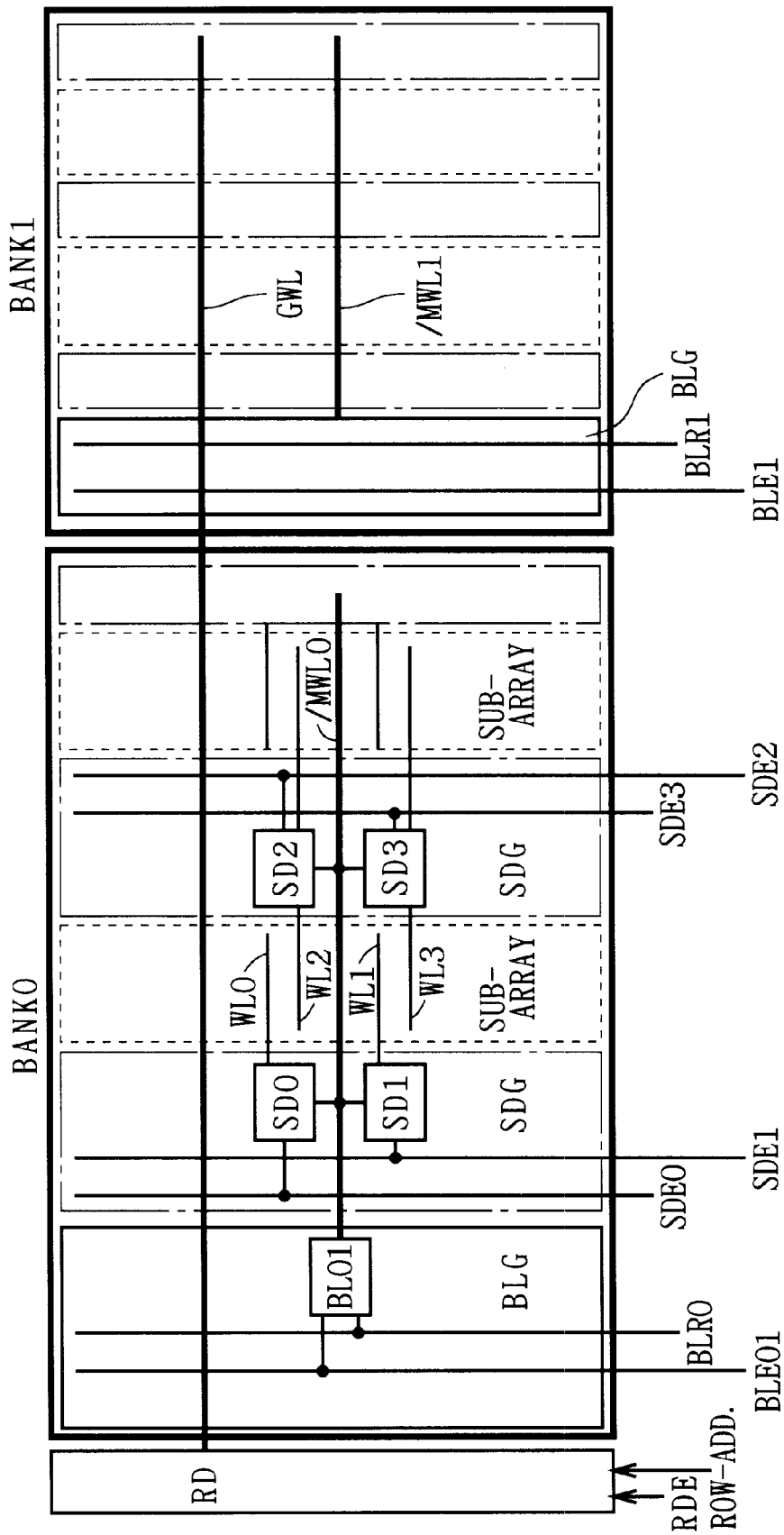

Variations of the bank latch BL and the sub-decoder SD are described below. FIGS. 6 and 7 are circuit diagrams of the variations of the structures of FIGS. 4 and 5, respectively. The variations of the structures shown in FIGS. 6 and 7 differ from the structures of FIGS. 4 and 5 in that the main word line is active low, not active high. Accordingly, the main word line MWLn is changed to a main word line /MWLn. Other constructions of FIGS. 6 and 7 are similar to those of FIGS. 4 and 5. The main word lines MWL shown in FIG. 1 are also changed to main word lines /MWL in accordance with the change from the main word line MWLn to the main word line /MWLn. FIG. 8 is a circuit diagram of the RAM including the main word lines /MWL.

Referring to FIG. 6, the pair of MOS transistors and the single MOS transistor shown in FIG. 4 for connecting the nodes NO1 and NO2 to the ground potential source are interchanged. The interchange provides the inverted relation between the active states of the main word line MWLn of FIGS. 4 and 6.

The variation of the sub-decoder SD is described with reference to FIG. 7. A switching portion comprised of one PMOS transistor and a switching portion comprised of a pair of NMOS transistors selectively apply the potential of the sub-decoder enable signal SDEm and the ground potential, respectively, to the word line WLm.

Specifically, the signal line for the sub-decoder enable signal SDEm is connected to the word line WLm through the source and drain electrodes of the PMOS transistor which turns on/off in response to the potential of the main word line /MWL0. The ground potential source is connected to the word line WLm through the source and drain electrodes of the pair of NMOS transistors which turn on/off in response to the respective potentials of the main word line /MWL0 and the sub-decoder enable signal /SDEm.

The sub-decoders having the structure shown in FIG. 7 offer the advantage of activating the word line WLm earlier than do the sub-decoders of FIG. 5 when the activation of the sub-decoder enable signal SDEm occurs earlier than the activation of the main word line /MWL0.

The bank latch BL illustrated in FIG. 6 wherein the active state of the main word line is inverted eliminates the advantage of the structure of FIG. 4 that the global word line GWL and the main word line MWLn which are both active high prevent the leakage current. Instead, the use of the bank latch BL illustrated in FIG. 6 provides the advantage in faster activation of the word line WL which is achieved by the sub-decoders shown in FIG. 7.

Figure 9:
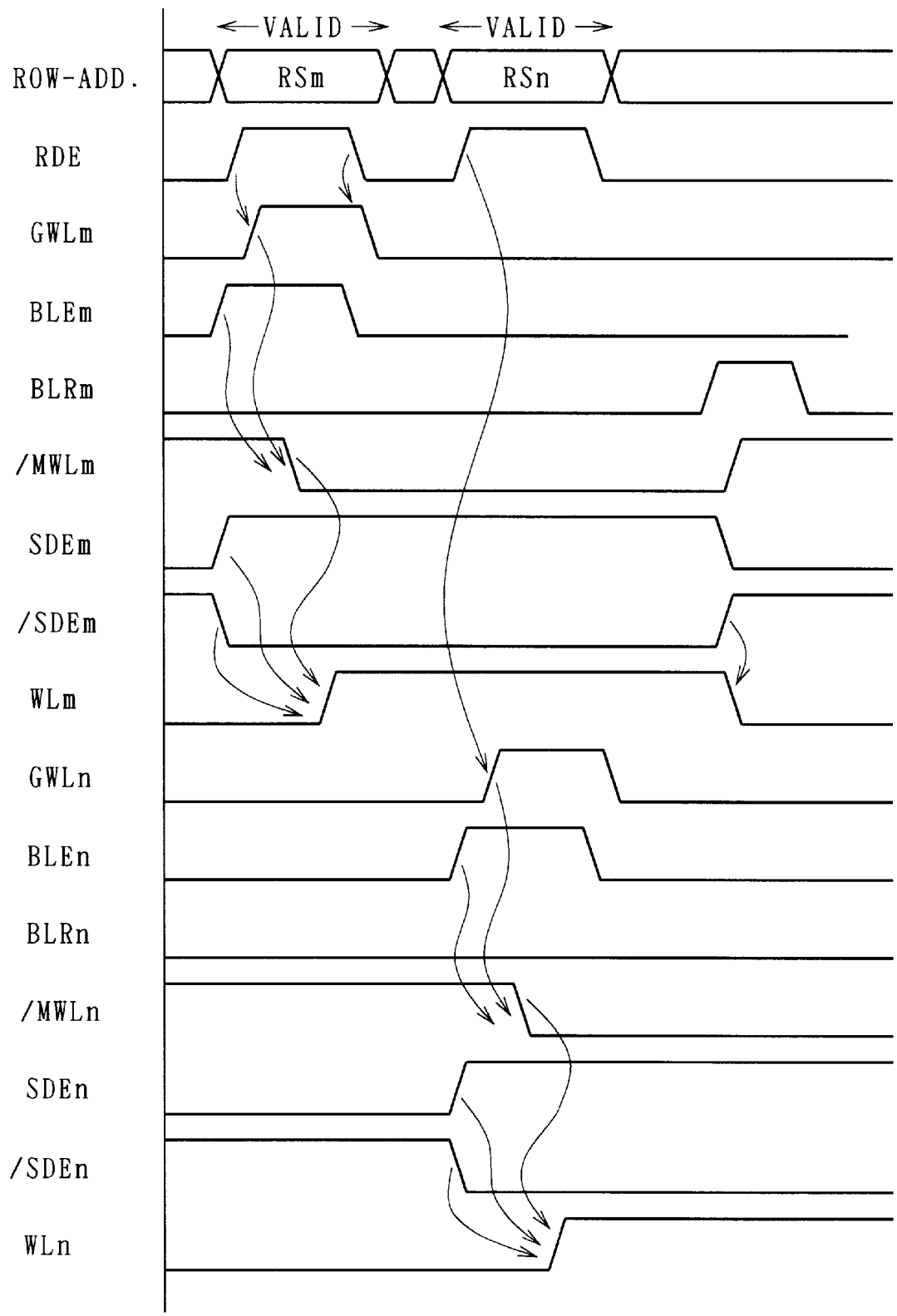
FIG. 9 shows waveforms of a timing chart of the second example of the architecture of the memory device according to the second preferred embodiment of the present invention.

FIG. 9 is a waveform chart showing changes in signals when the bank latch BL and the sub-decoder SD shown in FIGS. 6 and 7 are used. The signal changes of FIG. 9 are similar to those of FIG. 3 except that the state of the main word line /MWL of FIG. 9 is the inverse of that of the main word line MWL of FIG. 3.

Figure 10:
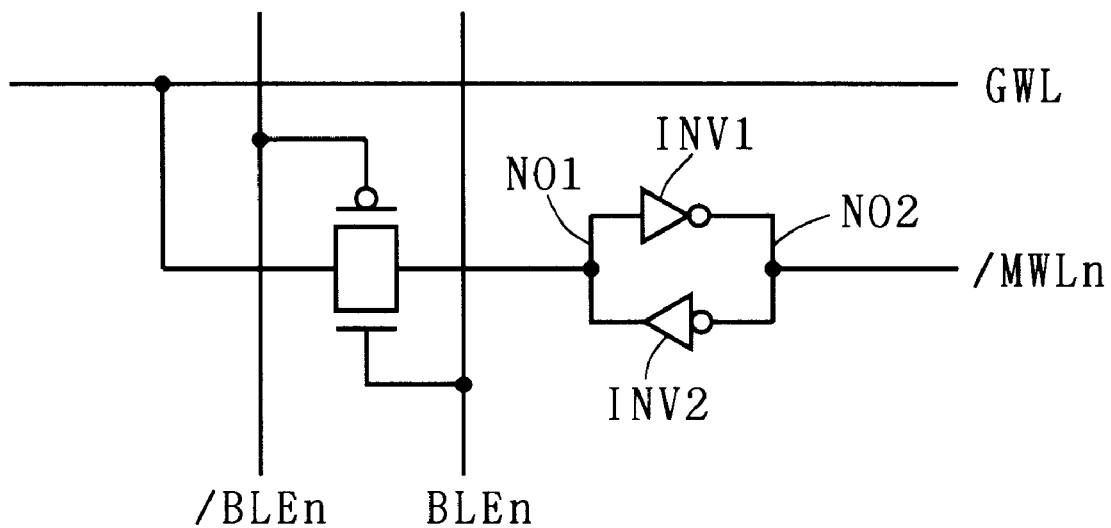
FIG. 10 is a circuit diagram of a third example of the architecture of the memory device according to the second preferred embodiment of the present invention.

FIG. 10 is a circuit diagram of another variation of the bank latch BL. The global word line GWL is connected to the node NOI through the source and drain electrodes of a transmission gate comprised of NMOS and PMOS transistors, the conduction of which is controlled by the bank latch enable signals BLEn and /BLEn, respectively. Such a structure of FIG. 10 does not require the bank latch reset signal BLR illustrated in FIGS. 4 and 6.

The structures shown in FIGS. 4 and 6 wherein the ground potential source and the latch are connected through the MOS transistors require the inverter INV3 for stabilization of the main word lines MWL and /MWL. However, the structure of FIG. 10 wherein the latch is connected to the global word line GWL through the transmission gate does not require the inverter INV3 shown in FIGS. 4 and 6. In the structure of FIG. 10, the inverter INV3 shown in FIGS. 4 and 6 is not provided, and the potential at the node NO2 equals the potential of the main word line /MWLn.

It is apparent that the structure of FIG. 10 has fewer transistors required than the structures of FIGS. 4 and 6. Therefore, the use of the structure of FIG. 10 may suppress the circuit area of the bank latch BL.

Third Preferred Embodiment

A circuit structure for generation of the bank latch enable signal BLE and the bank latch reset signal BLR is discussed in a third preferred embodiment according to the present invention. For the description of the circuit for generation of these signals, circuits and signals which have been used to control the banks will be first discussed briefly.

Figure 11:
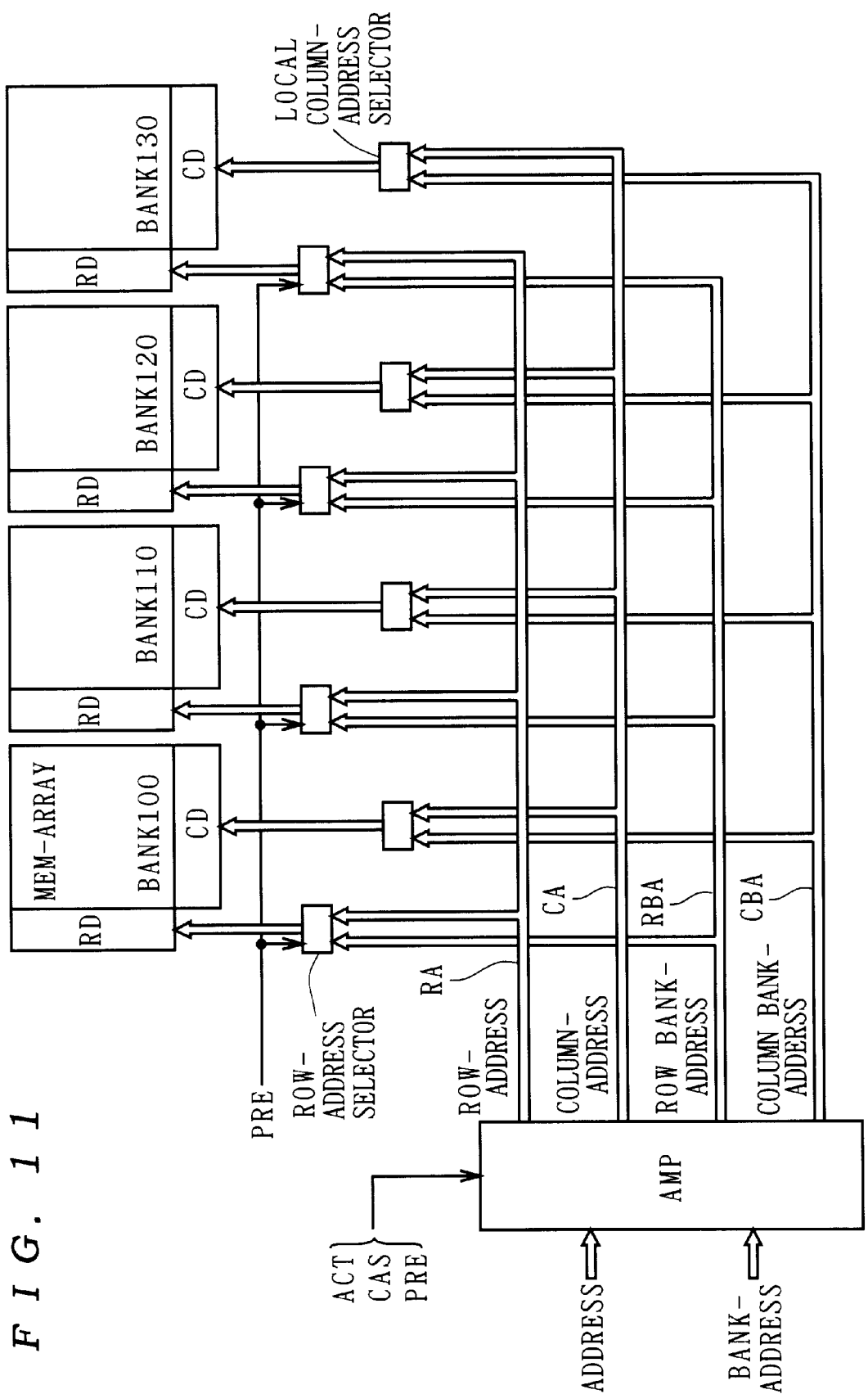
FIG. 11 is a circuit diagram of an architecture of a memory device which controls a plurality of memory arrays.
Figure 12:
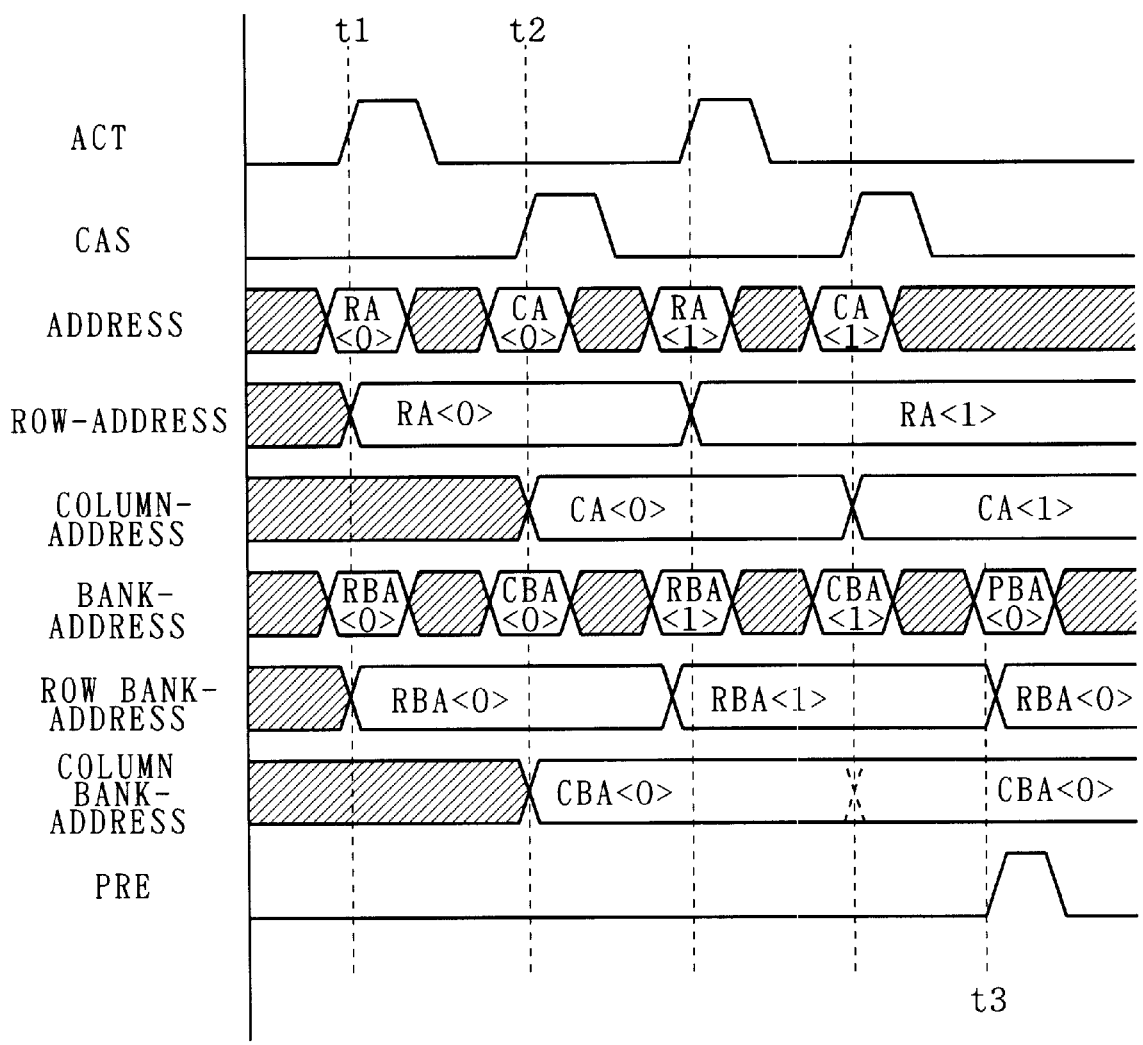
FIG. 12 shows waveforms of a timing chart of the memory device of FIG. 11.

FIG. 11 is a circuit diagram of an architecture for controlling the RAM wherein one memory array has one bank. The architecture of FIG. 11 comprises a total of four banks BANK100, BANK110, BANK120, BANK130 and uses a 2-bit bank-address. FIG. 12 shows waveforms of a timing chart of the circuit of FIG. 11. The shaded parts of FIG. 12 indicate "Don't Care". The numeral enclosed by "<>" of FIG. 12 is added for reference to the digit (bit) of the row-address and the like.

As illustrated in FIG. 11, an address and a bank-address are applied to an address multiplexer AMP from the exterior. The address multiplexer AMP receives control signals ACT, CAS, PRE, and the address and the bank-address are resolved in chronological order. The control signal ACT is a signal for simultaneously activating some of the memory cells in the memory array which have the same row-address. The control signal PRE is a signal (precharge signal) for resetting the active state of the memory array.

As illustrated in FIG. 12, the address applied to the address multiplexer AMP in response to the control signal ACT is outputted therefrom as a row-address RA. The address applied to the address multiplexer AMP in response to the control signal CAS is outputted therefrom as a column-address CA. Likewise, the bank-address applied to the address multiplexer AMP in response to the control signal ACT is outputted therefrom as a row bank-address RBA, and the bank-address applied to the address multiplexer AMP in response to the control signal CAS is outputted therefrom as a column bank-address CBA.

One of the row-address selectors provided respectively for the banks BANK100, BANK110, BANK120, BANK130 is activated on the basis of information of the row bank-address RBA. The activated row-address selector latches the row-address RA, and the row decoder corresponding to the activated row-address selector is activated.

The same is true for the column decoder CD. One of four local column-address selectors is activated on the basis of the column bank-address CBA, and the column-address CA is applied to the column decoder CD for the corresponding bank.

Information of a memory cell is outputted on the basis of the row-address RA and column-address CA applied respectively to the activated row decoder RD and column decoder CD. In this manner, the banks BANK100, BANK110, BANK120, BANK130 are independently controlled.

The bank-address applied to the address multiplexer AMP in response to the control signal PRE applied thereto serves as a precharge bank-address PBA. The row bank-address RBA is outputted in response to the precharge bank-address PBA to inactivate the corresponding bank. The latched state of the corresponding row-address selector is reset in response to the activation of the control signal PRE.

Figure 13:
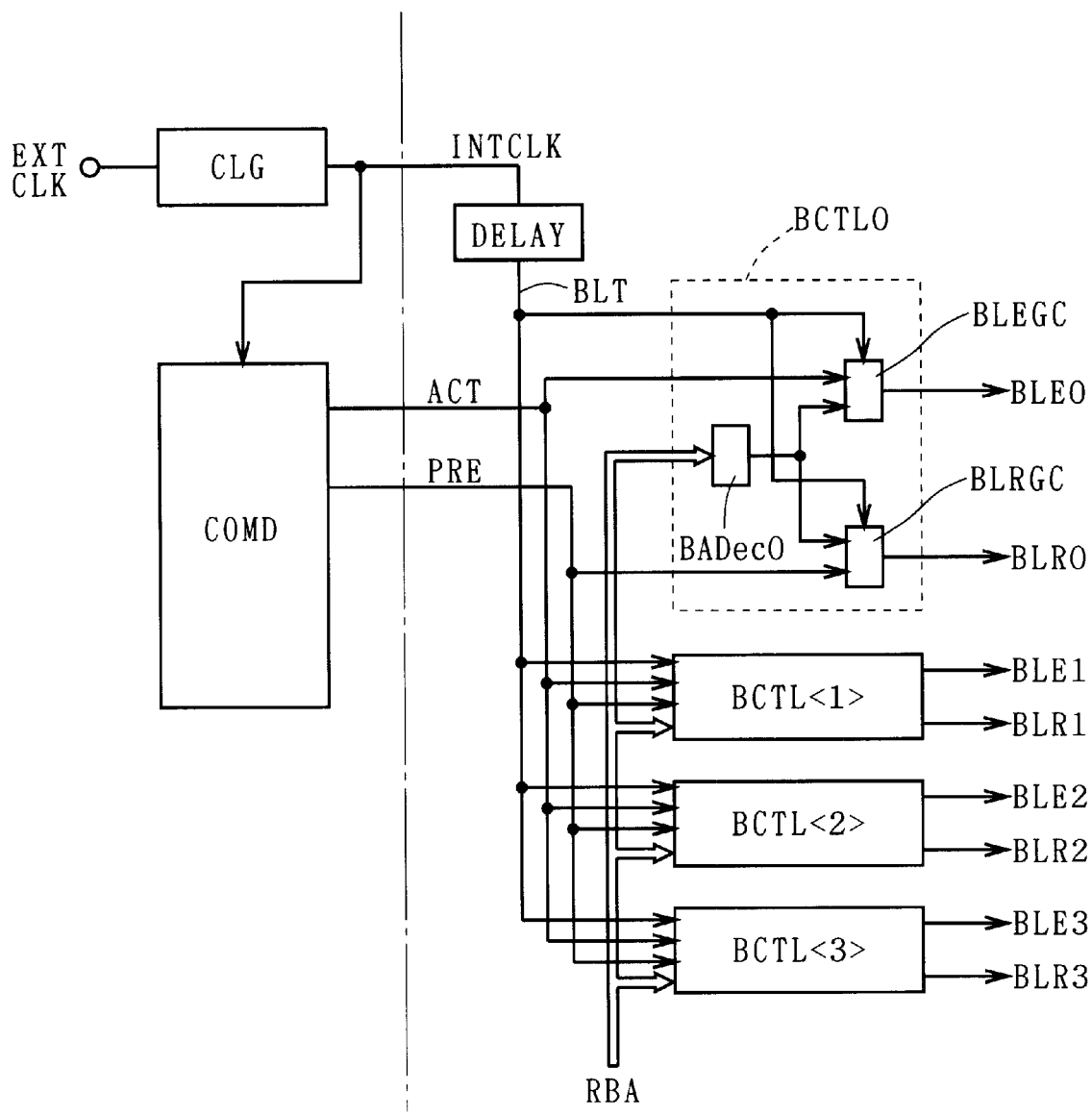
FIGS. 13 and 14 are circuit diagrams of an architecture of the memory device according to a third preferred embodiment of the present invention.

Description is given on the circuit architecture of the present invention utilizing the signals for use in the known circuit architecture described above. FIG. 13 is a circuit diagram of a circuit for generating the bank latch enable signal BLE and the bank latch reset signal BLR. The left-hand part of the circuit divided by the dashed-and-dotted line of FIG. 13 is a known circuit used for generation of the control signals ACT and PRE shown in FIGS. 11 and 12. A command decoder COMD receives a signal from the exterior not shown to generate the control signals ACT and PRE in synchronism with an internal clock INTCLK outputted from a clock generator CLG.

The internal clock INTCLK used for generation of the control signals ACT and PRE branches and is applied to a delay circuit. A bank latch trigger signal BLT from the delay circuit, the control signals ACT, PRE, and the row bank-address RBA are commonly applied to bank latch control signal generation circuits BCTL of the present invention each of which generates the bank latch enable signal BLE and bank latch reset signal BLR.

Figure 14:
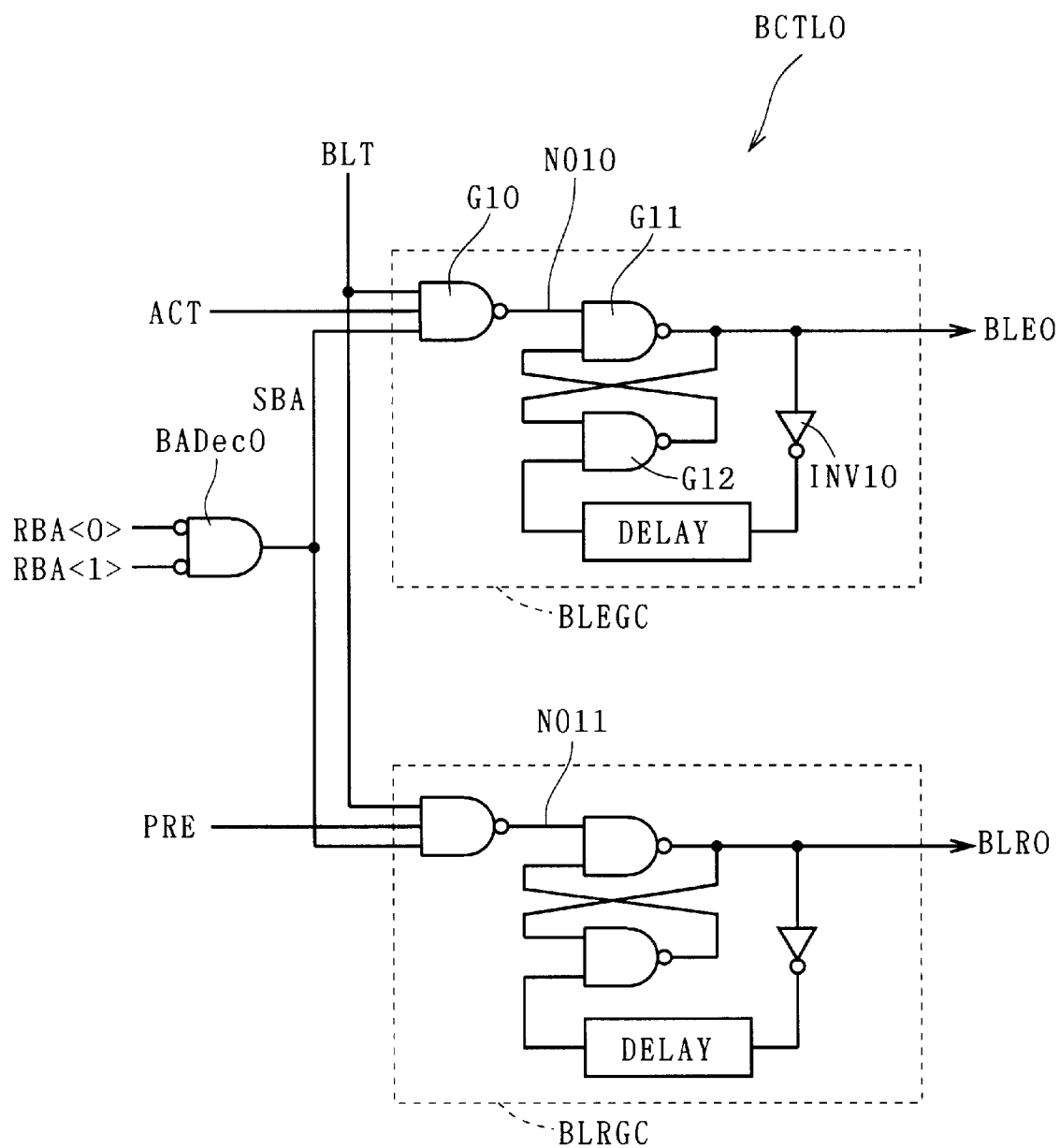
Figure 15:
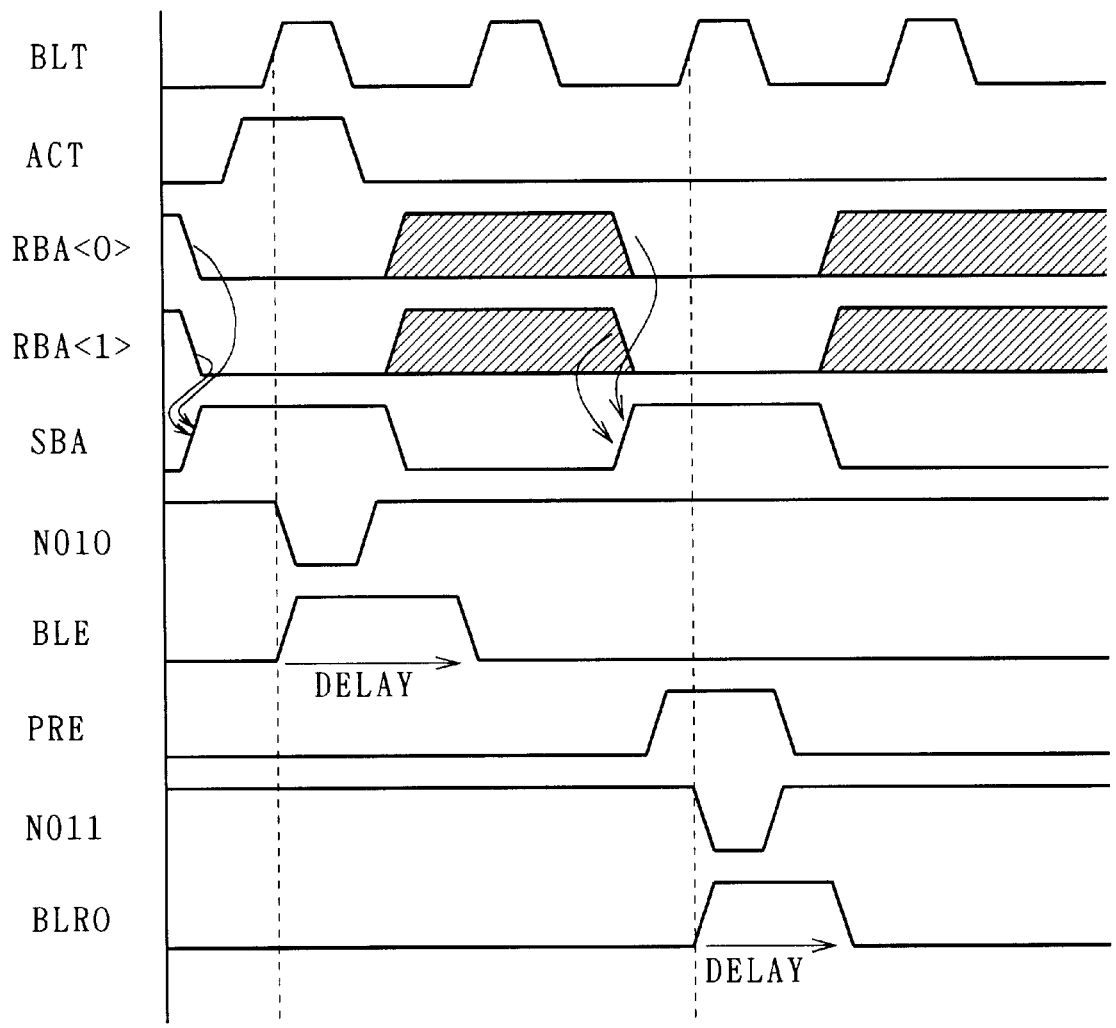
FIG. 15 shows waveforms of a timing chart of the architecture of the memory device according to the third preferred embodiment of the present invention.

FIG. 14 is a circuit diagram of a bank latch control signal generation circuit BCTL0. The bank latch control signal generation circuit BCTL0 comprises a gate element BADec0 receiving the digits of the row bank-address RBA, a bank latch enable signal generation circuit BLEGC, and a bank latch reset signal generation circuit BLRGC. FIG. 15 shows waveforms of a timing chart of the bank latch control signal generation circuit BCTL0 of FIG. 14.

The gate element BADec0 activates a signal SBA as illustrated in FIG. 15 when the binary number represented by the two digits of the row bank-address RBA is "0" which matches the numeral "0" in the reference character of the bank latch control signal generation circuit BCTL0.

Each of the bank latch enable signal generation circuit BLEGC and the bank latch reset signal generation circuit BLRGC includes a NAND gate receiving the bank latch trigger signal BLT outputted from the delay circuit for delaying the internal clock INTCLK shown in FIG. 13, and the signal SBA. The bank latch enable signal generation circuit BLEGC further receives the signal ACT, and the bank latch reset signal generation circuit BLRGC further receives the signal PRE.

The generation circuits BLEGC and BLRGC are similar in construction except that they receive the different signals ACT and PRE. Thus, only the generation circuit BLEGC is described hereinafter.

The bank latch enable signal generation circuit BLEGC further includes a pair of NAND gates G11 and G12 connected such that the output terminal of one of the NAND gates G11 and G12 is connected to a first input terminal of the other. The gate G11 has a second input terminal connected to the output terminal of the NAND gate G10 receiving the bank latch trigger signal BLT and the like. The output from the NAND gate G11 is outputted as the bank latch enable signal BLE0 and also applied to the input terminal of an inverter INV10. The output terminal of the inverter INV10 is connected to a second input terminal of the NAND gate G12 through a delay circuit.

The above described circuit arrangement generates the bank latch enable signal BLE0 as illustrated in FIG. 15. The signal SBA is activated when the two digits of the row bank-address is both "L". With the signal SBA active, the potential at a node NO10 connected to the output terminal of the NAND gate G10 goes low at the rising edge of the bank latch trigger signal BLT. The NAND gate G11 accordingly outputs the bank latch enable signal BLE0 which is "H". Since the output from the inverter INV10 of FIG. 14 is applied to the NAND gate G12 through the delay circuit, the bank latch enable signal BLE0 is held high for a period of time corresponding to the delay caused by the delay circuit.

The bank latch reset signal generation circuit BLRGC generates the bank latch reset signal BLR0 on similar principles although the circuit BLRGC receives the signal PRE in place of the signal ACT.

Figure 16:
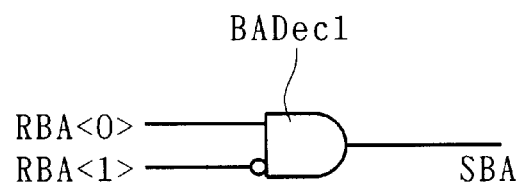
FIGS. 16 through 18 are circuit diagrams of the architecture of the memory device according to the third preferred embodiment of the present invention.
Figure 17:
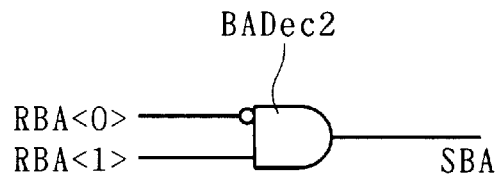
Figure 18:
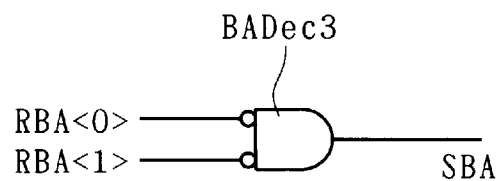

The architecture of bank latch control signal generation circuits BCTL1 to BCTL3 is discussed below. The bank latch control signal generation circuits BCTL1 to BCTL3 comprise gate elements BADec1 to BADec3 shown in FIGS. 16 through 18, respectively, provided in place of the gate element BADec0 of the bank latch control signal generation circuit BCTL0. FIGS. 16 through 18 are circuit diagrams of the gate elements BADec1 to BADec3, respectively.

The gate element BADec1 of the bank latch control signal generation circuit BCTL1 activates the signal SBA when the binary number represented by its RBA<1> and RBA<0> of the row bank-address is "1" which corresponds to the numeral "1" in the reference character of the bank latch control signal generation circuit BCTL1. Likewise, the gate elements BADec2 and BADec3 shown in FIGS. 17 and 18 activate the signal SBA when the bank-address represents the numerals "2" and "3" in the reference characters of the bank latch control signal generation circuits BCTL2 and BCTL3, respectively.

The above described construction of the gate elements BADec allows the selective activation of the signal SBA in only one of the bank latch control signal generation circuits BCTL0 to BCTL3 which is specified by the row bank-address, permitting the activation of the bank latch enable signal BLE and the bank latch reset signal BLR only in the intended bank. That is, the banks may be independently controlled.

Since the bank latch enable signal BLEn and the bank latch reset signal BLRn are commonly applied throughout the bank BANKn, the bank BANKn is required to comprise the single bank latch control signal generation circuit BCTLn. This structure requires a smaller circuit area than the structure wherein the bank latch enable signals BLEn(i) and the bank latch reset signals BLRn(i) are generated individually for the plurality of bank latches BLn(i) in the bank BANKn. The character (i) is added for individual reference to the plurality of independent bank latches BLn in the bank BANKn.

Fourth Preferred Embodiment

Figure 19:
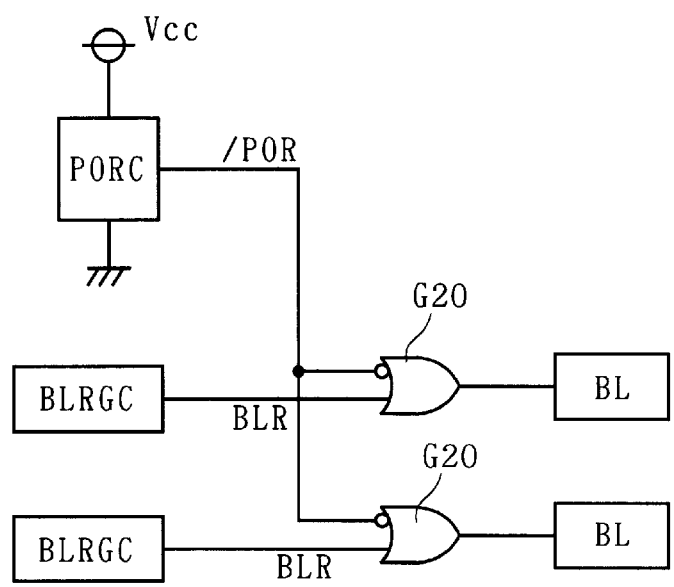
FIGS. 19 and 20 are circuit diagrams of an architecture of the memory device according to a fourth preferred embodiment of the present invention.

The RAM constructed such that all bank latches BL are reset when power is turned on is described in a fourth preferred embodiment according to the present invention. FIG. 19 is a circuit diagram of the RAM according to the fourth preferred embodiment. Gate elements G20 each having a first input terminal receiving a signal /POR from a reset compelling circuit PORC are connected between the bank latch reset signals BLR outputted from the bank latch control signal generation circuits BLRGC shown in FIG. 14 and the bank latches BL, respectively. The gate element G20 is a circuit for ORing the inverted logic of the signal /POR and the bank latch reset signal BLR.

The reset compelling circuit PORC inactivates the signal /POR with a delay from the start-up of the power supply Vcc. The gate element G20 illustrated in FIG. 19 applies "H" to the bank latch BL in response to the active signal /POR during the time interval between the start-up of the power supply Vcc and the inactivation of the signal /POR.

The gate element 20 of such a construction resets the bank latch BL when the power supply Vcc turns on or when the reset signal BLR is activated. As shown in FIG. 19, the provision of the respective gate elements G20 between all bank latch control signal generation circuits BLRGC and the bank latches BL enables all bank latches BL to be reset when power is turned on.

Figure 20:
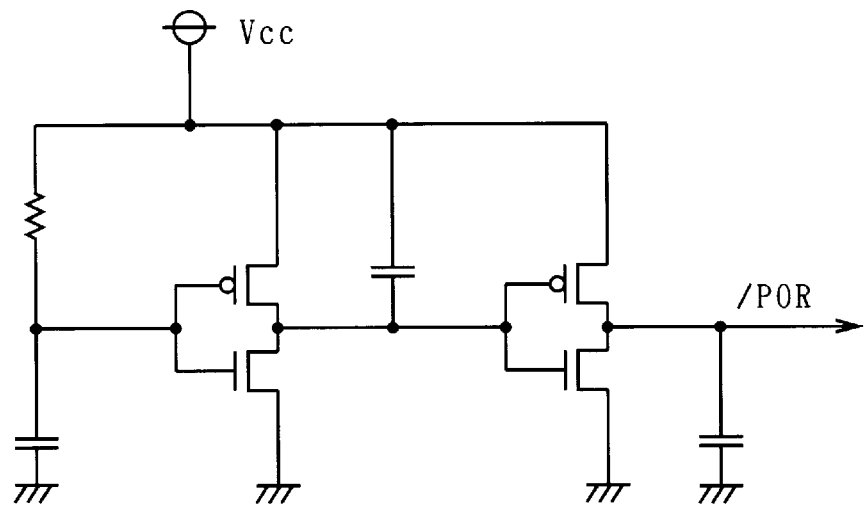

When power is turned on, the contents of the bank latches BL are reset without exception, and the bank latches BL do not hold unnecessary states. This prevents the memory circuit from malfunctioning when power is turned on. FIG. 20 is a detailed circuit diagram of the reset compelling circuit PORC. The structure shown in FIG. 20 is known in the art, and the description of the structure will be dispensed with.

Fifth Preferred Embodiment

Figure 21:
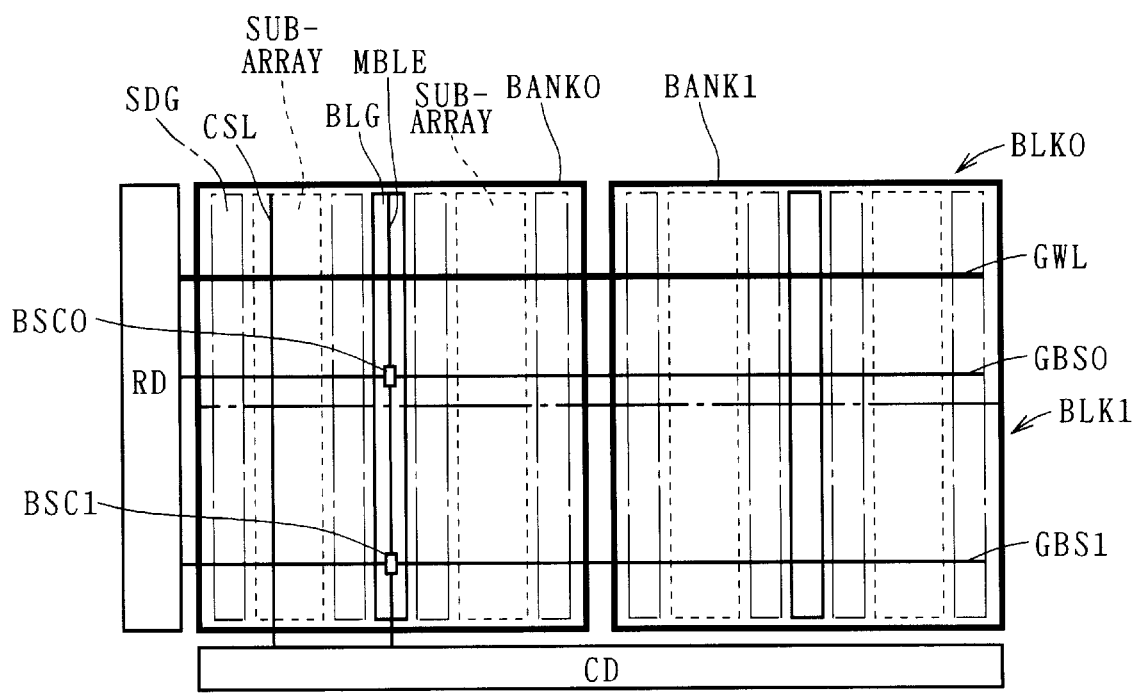
FIGS. 21 and 22 are circuit diagrams of an architecture of the memory device according to a fifth preferred embodiment of the present invention.

FIG. 21 is a circuit diagram of the RAM according to a fifth preferred embodiment of the present invention. The RAM of FIG. 21 comprises block selection circuits BSC, global block selection lines GBS, and a main bank latch enable signal MBLE in addition to the RAM of FIG. 1, with portions in association with the addition being changed. The portions subjected to the addition and changes are described below.

Each of the banks BANK0 and BANK1 is divided into upper and lower blocks BLK0 and BLK1 arranged in the column direction as indicated by the dashed-and-dotted line of FIG. 21. That is, each of the sub-arrays, the sub-decoder groups SDG, and the bank latch groups BLG is divided into two by the boundary indicated by the dashed-and-dotted line of FIG. 21.

The blocks BLK0 and BLK1 comprise the single block selection circuits BSC0 and BSC1, respectively. The block selection circuits BSC0 and BSC1 are connected respectively to independent global block selection lines GBS0 and GBS1 and connected commonly to the main bank latch enable signal MBLE. Such connections permit the block selection circuits BSC0 and BSC1 to be commonly controlled by the main bank latch enable signal MBLE and independently controlled by respective signals from the global block selection lines GBS0 and GBS1.

Figure 22:
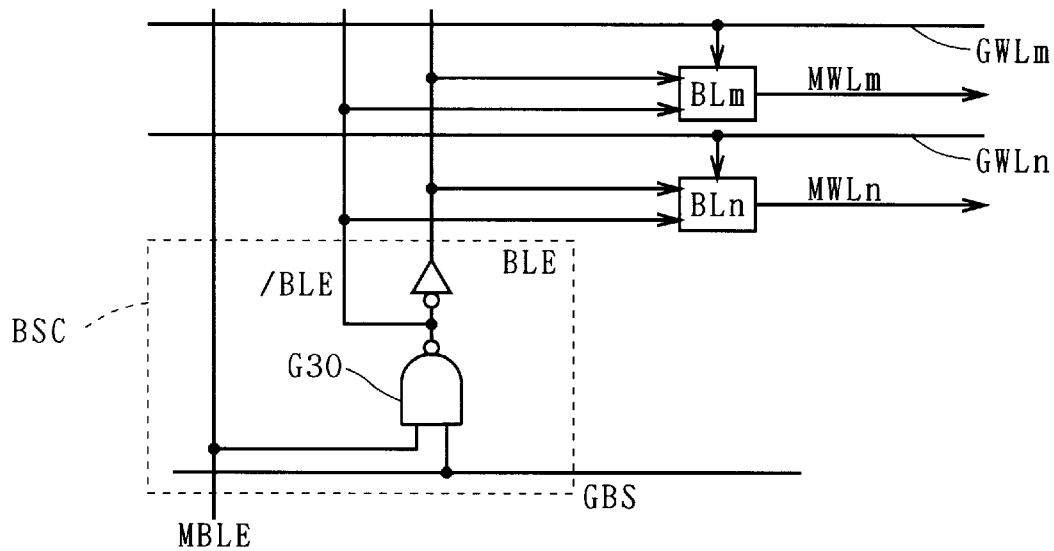

FIG. 22 is a circuit diagram of the block selection circuit BSC. The main bank latch enable signal MBLE and the signal from the global block selection line GBS are applied to a NAND gate G30. The output from the NAND gate G30 is divided into two branches: one inverted by an inverter to serve as the bank latch enable signal BLE, and the other serving as the bank latch enable signal /BLE as it is. The structure of the block selection circuit BSC causes the bank latch enable signals BLE and /BLE to be asserted high and low, respectively, only when both the main bank latch enable signal MBLE and the global block selection line GBS are asserted high.

As illustrated in FIG. 22, the bank latch enable signals BLE and /BLE are commonly applied to all bank latches BL included in one of the two parts into which the bank latch group BLG shown in FIG. 21 is divided. That is, the same block selection circuit BSC applies the bank latch enable signals BLE and /BLE to all bank latches BL included in the same block BLK shown in FIG. 21.

The bank latches BL having, for example, the structure shown in FIG. 10 are operated commonly by the bank latch enable signals BLE and /BLE, but receive signals from the independently activated global word lines GWL to hold independence. Thus, the plurality of bank latches BL may selectively activate one of the main word lines MWL.

As illustrated in FIG. 21, the block selection circuit BSC is provided for each block BLK. Further, each of the block selection circuits BSC receives the signal from the global block selection line GBS to hold independence. This achieves the activation of the bank latch enable signals BLE and /BLE only in one of the blocks BLK of the single bank BANK. The independent activation of the bank latch enable signals BLE and /BLE for each block BLK provides effects to be described below.

For example, the bank latch enable signals BLE and /BLE must drive the transmission gate of the bank latch BL as shown in FIG. 10. Thus, the common application of the activated bank latch enable signals BLE and /BLE to all bank latches BL of the single bank BANK as in the first preferred embodiment substantially increases the load on the bank latch enable signals BLE and /BLE. This decreases the operating speed of the memory circuit.

However, in the structure shown in FIG. 21 wherein the block selection circuit BSC is provided for each block BLK, the activated bank latch enable signals BLE and /BLE are applied to only the bank latches BL of the blocks BLK containing the global word line GWL to be selectively activated. Thus, the load capacitance is decreased by the amount of the transmission gates of the blocks BLK including the inactive global word line GWL. This allows higher operating speeds than the RAM, for example, shown in FIG. 1 wherein the transmission gates of all bank latches BL of the single bank BANK must be driven.

A mechanism for generating the main bank latch enable signal MBLE and the global block selection line GBS is described below. In the structure of FIG. 14, the bank latch enable signals BLE are generated from the row bank-address RBA and the control signals ACT and BLT. To prevent impairment of the dependence of the bank latch enable signals BLE upon the row bank-address RBA and the like, the bank latch enable signal generation circuit BLEGC shown in FIG. 14 should be used just as it is to produce the main bank latch enable signal MBLE of FIG. 22.

Further, the global block selection lines GBS0, GBS1 illustrated in FIG. 21 must be activated independently for each of the blocks BLK0, BLK1. To ensure this dependence, the row decoder RD should have the function of selectively activating the global block selection lines GBS included in the blocks BLK containing the global word line GWL to be selectively activated.

In the circuit of FIG. 22, the bank latch enable signals BLE and /BLE are generated. Alternatively, an additional circuit identical with the circuit of FIG. 22 may be provided to generate the bank latch reset signal BLR in place of the bank latch enable signal /BLE independently of the bank latch enable signal BLE.

The single bank BANK is divided into two blocks BLK in the above description. Of course, the single bank BANK may be divided into more than two blocks. The provision of the block selection circuit BSC for each block BLK allows control of the active state of the bank latch enable signal BLE and the like for each block BLK.

Sixth Preferred Embodiment

Figure 23:
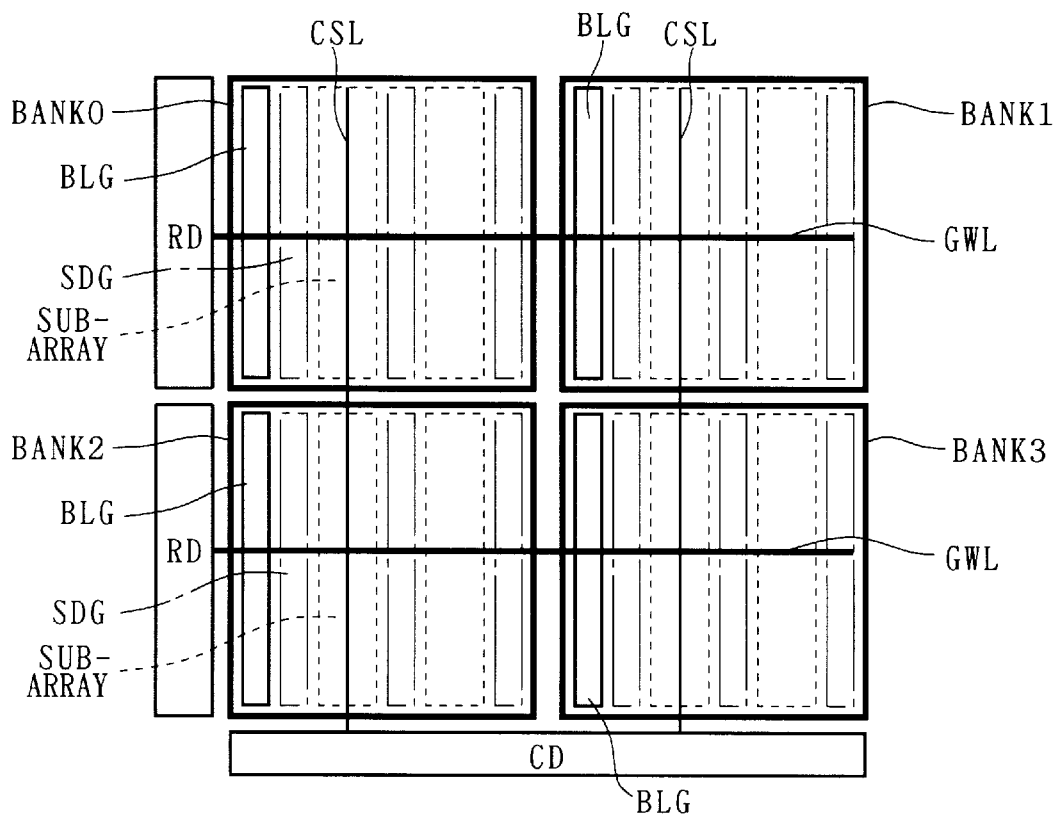
FIG. 23 is a circuit diagram of an architecture of the memory device according to a sixth preferred embodiment of the present invention.
Figure 38:
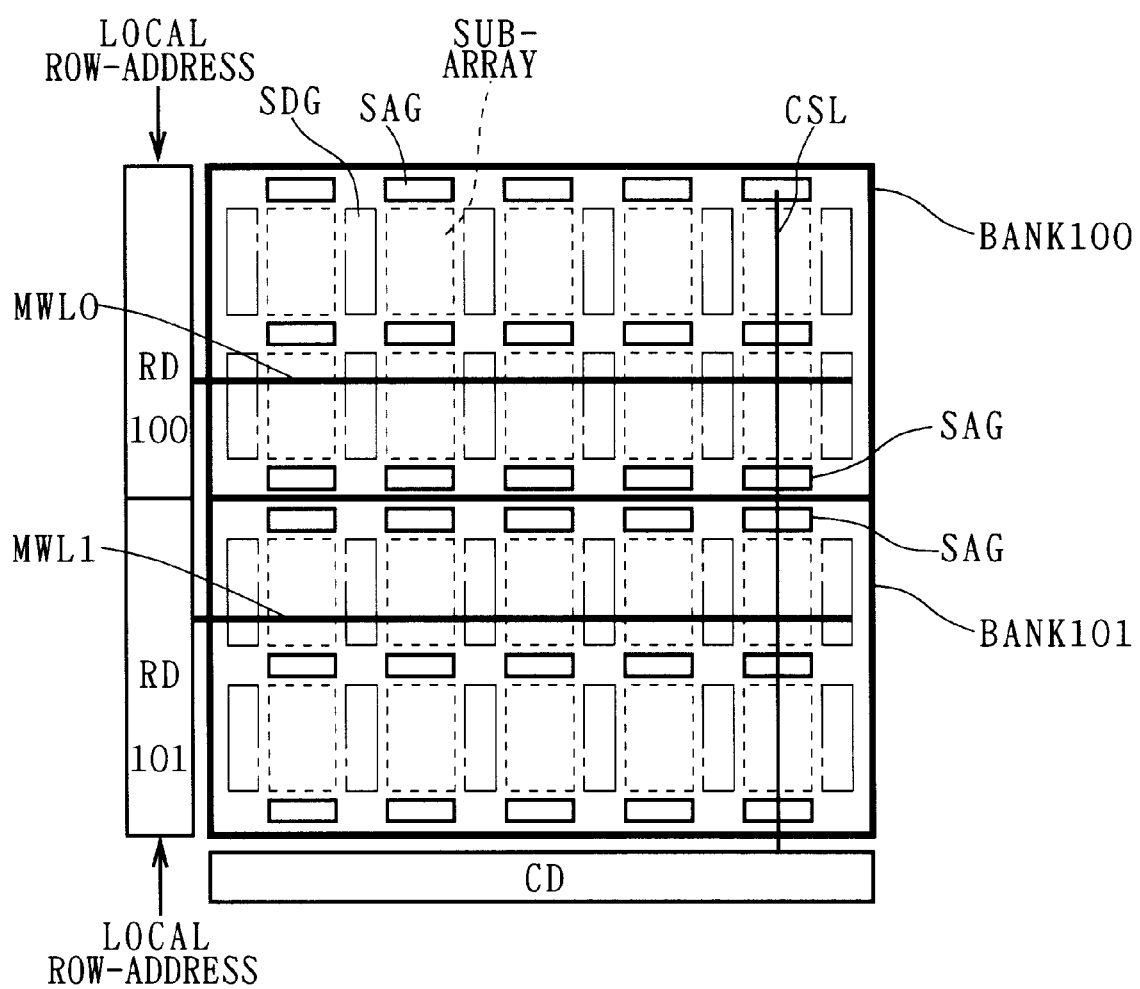
FIG. 38 is a circuit diagram of another background art memory device architecture.

FIG. 23 is a circuit diagram wherein the conventional memory array of FIG. 38 divided in the column direction is further divided in the row direction by the technique of the first preferred embodiment of the present invention. The division of the memory array by using the conventional technique and the technique of the present invention provides a smaller circuit area than the division thereof using one of the conventional technique and the technique of the present invention, as will be described below.

Figure 24:
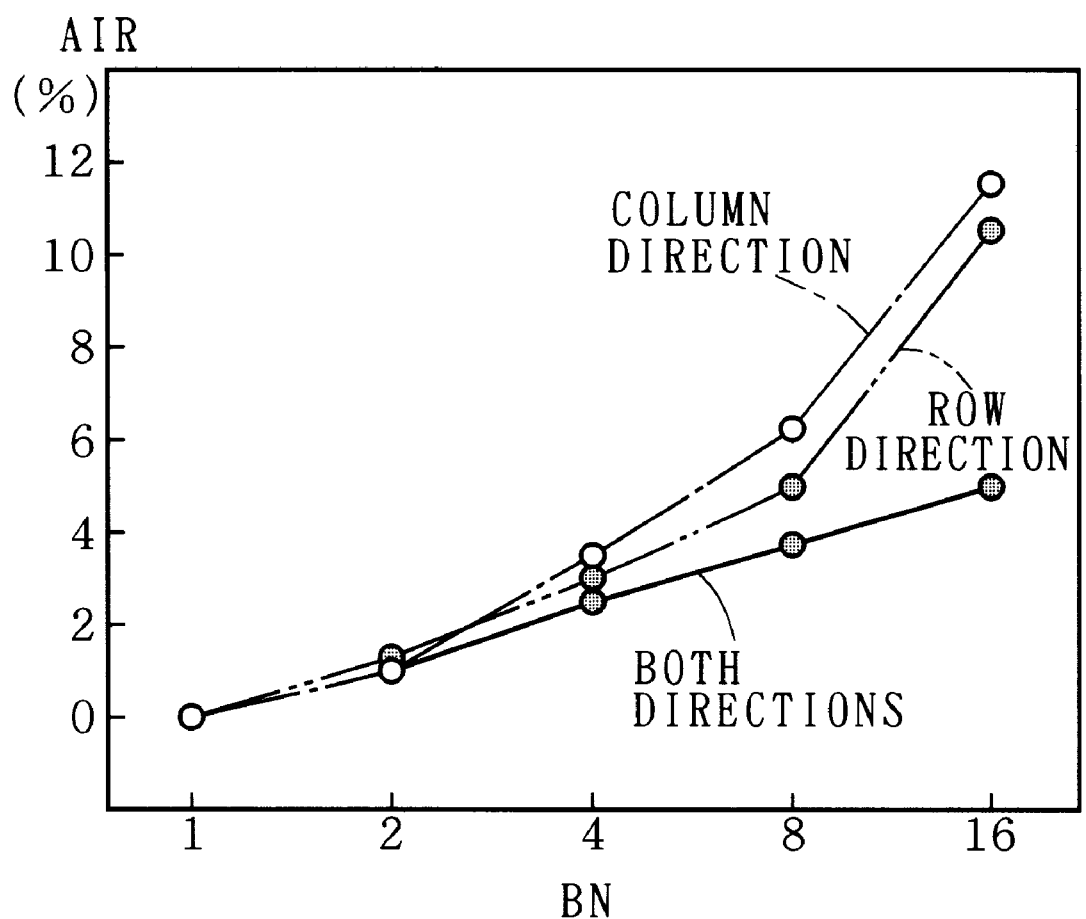
FIG. 24 is a graph illustrating the correlation between the number of banks into which a memory array is divided and the rate of increase in circuit area.

FIG. 24 is a graph illustrating the correlation between the number of banks BN produced by division which is represented in logarithmic form on the horizontal axis and the rate of increase AIR in area for the memory array divided in both the row and column directions as indicated by the solid line, for the memory array divided in only the row direction as indicated by the alternate long and two short dash line, and for the memory array divided only in the column direction as indicated by the alternate long and short dash line.

The division of the memory array into banks only in the row direction as illustrated in FIG. 1 involves the need to add the bank latch groups BLG extending in the column direction so as to be arranged in the row direction, the number of added bank latch groups BLG equaling the number of banks created by the division. The division of the memory array into banks only in the column direction as illustrated in FIG. 38 involves the need to add the sense amplifier groups SAG extending in the row direction so as to be arranged in the column direction, the number of added sense amplifier groups SAG equaling the number of banks created by the division. Thus, the division of the memory array into banks only in one direction results in the addition of circuits arranged in the one direction so that the number of added circuits equals the number of banks created by the division. The number of banks BN is roughly directly proportional to the area increase rate AIR.

In the case of the division of the memory array into banks in both directions, the increase in both the number of sense amplifier groups SAG and the number of bank latch groups BLG may conform to the increase in the number of banks BN. Thus, the area increase rate AIR is directly proportional to the square root of the number of banks BN.

Based on the above described principles, the division in both directions minimizes the increase in circuit area as illustrated in FIG. 24. The division of the memory array into banks in the two directions by the conventional technique and the technique of the present invention provides the efficient division of the memory array into a desired number of banks.

Seventh Preferred Embodiment

Figure 25:
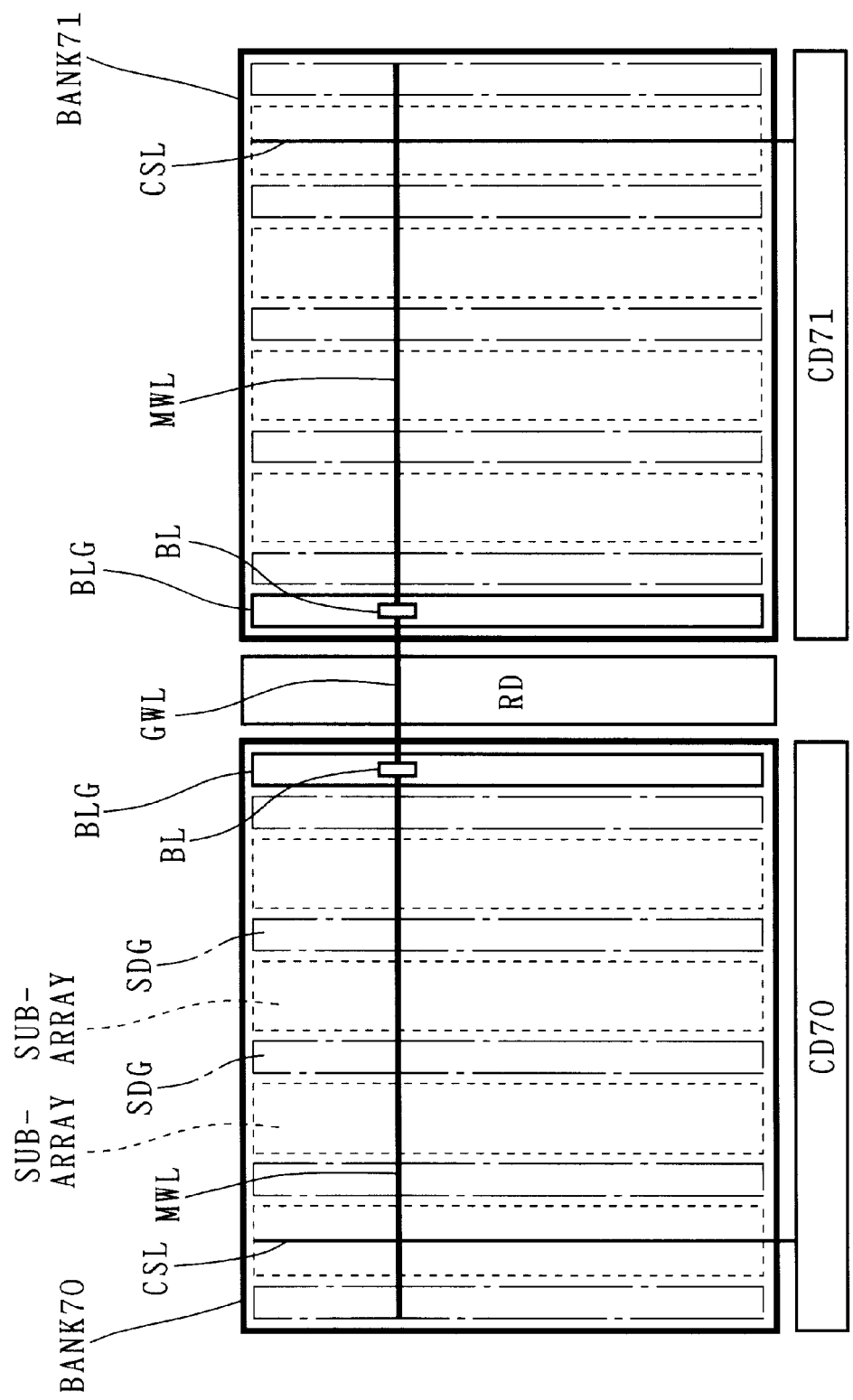
FIG. 25 is a circuit diagram of an architecture of the memory device according to a seventh preferred embodiment of the present invention.

FIG. 25 is a circuit diagram of the RAM wherein the single row decoder RD controls banks (memory arrays) BANK70, BANK71 controlled respectively by column decoders CD70, CD71. The banks BANK70, BANK71 have the common global word line GWL and comprise respective bank latch groups BLG. The global word line GWL is connected to the main word lines MWL of the banks BANK70, BANK71 through the bank latches BL respectively.

In the architecture of FIG. 25, the independent control of the bank latches BL for each of the banks BANK70, BANK71 allows the independent control of the plurality of banks by the single row decoder. The principle that the common global word line is provided for the plurality of banks and the states of the main word lines are latched by the latches is similar to the principle of the first preferred embodiment. That is, the seventh preferred embodiment is a first variation of the first preferred embodiment. The row decoder is shared between the plurality of banks, providing the effect of reducing the circuit area.

Eighth Preferred Embodiment

The plurality of bank latch BL and main word line MWL pairs arranged in the row direction are provided for the global word line GWL as illustrated in FIG. 1 in the first preferred embodiment. That is, the plurality of bank latch BL and main word line MWL pairs are arranged in parallel as viewed in the column direction in association with the single global word line GWL. In this structure, the single pair is allocated to the single global word line GWL in each of the banks after the division provided in units of the main word line MWL.

In an eighth preferred embodiment according to the present invention, the plurality of bank latch BL and main word line MWL pairs are arranged in parallel as viewed in the row direction and connected commonly to the global word line GWL.

Figure 26:
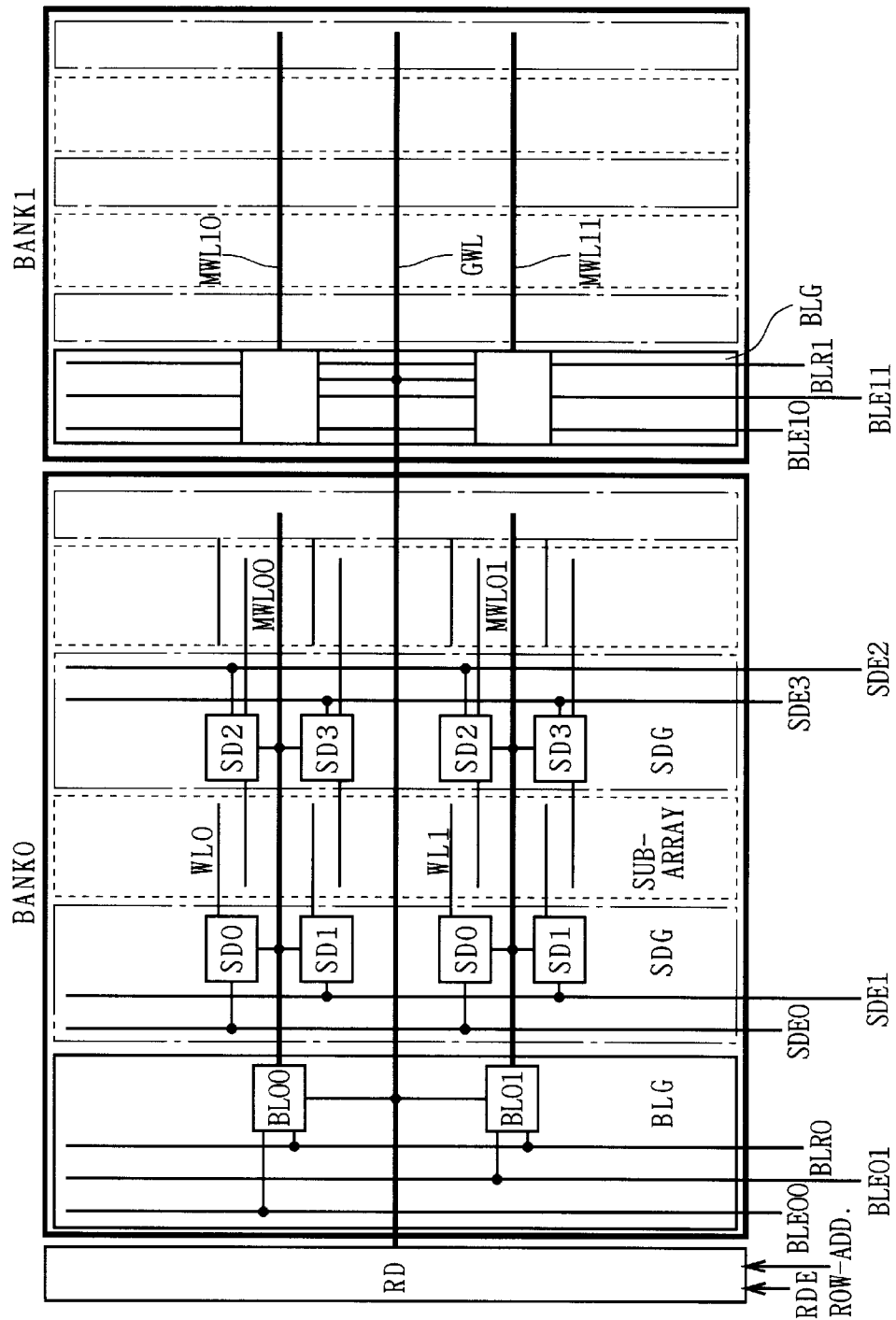
FIG. 26 is a circuit diagram of an architecture of the memory device according to an eighth preferred embodiment of the present invention.

FIG. 26 is a circuit diagram of the RAM according to the eighth preferred embodiment of the present invention. In the bank BANK0, two bank latches BL00 and BL01 are commonly connected to the global word line GWL. The bank latches BL00 and BL01 are independently controlled respectively by bank latch enable signals BLE00 and BLE01 and are simultaneously reset by the bank latch reset signal BLR0. This allows the independent activation of main word lines MWL00 and MWL01 connected respectively to the bank latches BL00 and BL01.

Each of the main word lines MWL00 and MWL01 is connected to the plurality of sub-decoders SD as in the first preferred embodiment. The main word lines MWL00 and MWL01 which are independently activated selectively activate one of the plurality of word lines WL in each sub-array. The word lines WL are activated independently for each bank BANK on the basis of the same principles as those of the first preferred embodiment.

In the eighth preferred embodiment, the plurality of bank latches BL are commonly connected to the single global word line GWL in the single bank BANK. Since the single main word line MWL is connected to each bank latch BL, the eighth preferred embodiment includes fewer global word lines for activating the main word lines MWL than does the first preferred embodiment. The pitch of the global word lines GWL is alleviated during the layout of the global word lines GWL.

The alleviation of the pitch is particularly significant when the global word lines GWL and the main word lines MWL are formed as the same metal layer. The use of the architecture of the eighth preferred embodiment facilitates the layout.

The bank latches BL00 and BL01 are simultaneously reset by the bank latch reset signals BLR0 in the architecture of FIG. 26. Instead, individual bank latch reset signals for the bank latches BL00 and BL01 may be prepared.

Ninth Preferred Embodiment

The first to eighth preferred embodiments illustrate the independent banks BANK controlled by the single row decoder RD. Achievement of a substantial architecture wherein the word lines WL are activated independently in the individual banks BANK requires the independent control of the sense amplifier groups SAG shown in FIG. 1 for each bank BANK. Such an architecture is described in a ninth preferred embodiment according to the present invention.

FIG. 27 is a circuit diagram of the RAM according to the ninth preferred embodiment of the present invention. Sense amplifier control circuits SACTL are disposed on opposite sides of the bank latch groups BLG in the column direction. Each of the sense amplifier control circuits SACTL is provided in common to the plurality of sense amplifier groups SAG arranged in the row direction in the single bank BANK.

A common global sense amplifier equalizing signal GSAEQ is applied from the row decoder RD to each group of sense amplifier control circuits SACTL arranged in the row direction across the plurality of banks BANK. The common bank latch enable signal BLE and the common bank latch reset signal BLR are applied to each group of sense amplifier control circuits SACTL arranged in the column direction.

The global sense amplifier equalizing signal GSAEQ is independently controlled for each of the groups of sense amplifier control circuits SACTL arranged in the row direction. The bank latch enable signal BLE and the bank latch reset signal BLR are independently controlled for each of the groups of sense amplifier control circuits SACTL arranged in the column direction. The sense amplifier control circuit SACTL has a latch function and is hence activated for each bank BANK because of the above described signal arrangement. This is based on the principles similar to those for independently controlling the bank latches BL for each bank.

Figure 28:
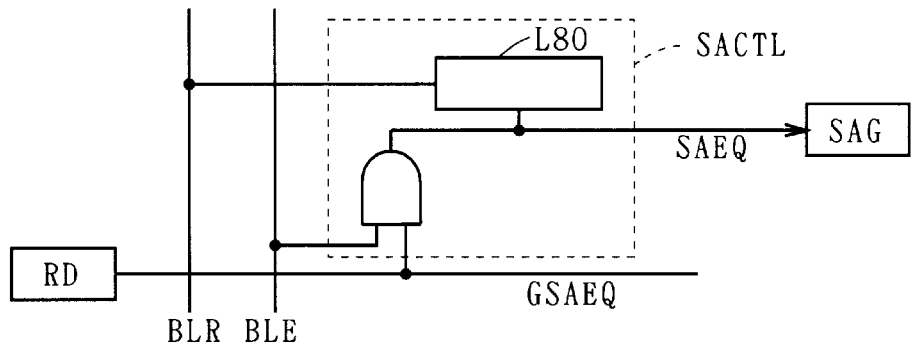
FIG. 28 is a circuit diagram of a first example of the architecture of the memory device according to the ninth preferred embodiment of the present invention.

FIG. 28 is a circuit diagram of the sense amplifier control circuit SACTL. The sense amplifier control circuit SACTL comprises an AND gate which outputs "H" only when the bank latch enable signal BLE and the global sense amplifier equalizing signal GSAEQ are both active, and a latch L80 for latching the output from the AND gate.

When at least one of the bank latch enable signal BLE and the global sense amplifier equalizing signal GSAEQ is inactive, the AND gate outputs "L", but the latch L80 maintains a sense amplifier equalizing signal SAEQ active. The latch L80 is reset in response to the activation of the bank latch reset signal BLR, and then the sense amplifier equalizing signal SAEQ becomes inactive. The structure of the latch L80 having the above described function is well known in the art, and the detailed illustration and description of the internal structure thereof will be dispensed with herein.

Figure 29:
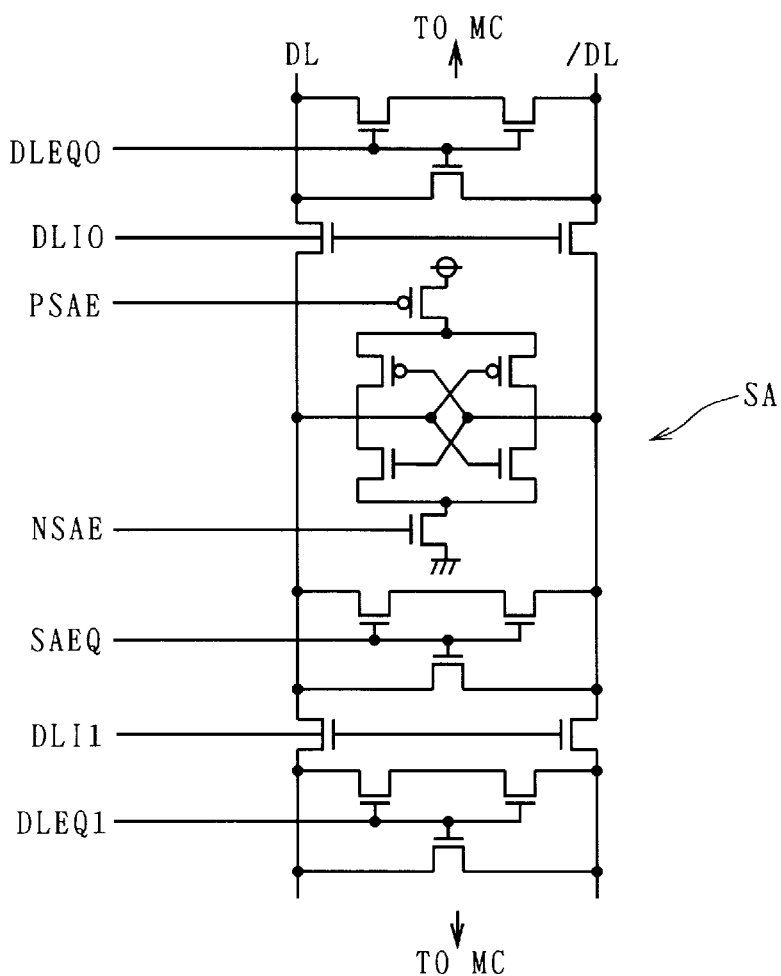
FIG. 29 is a circuit diagram of a sense amplifier.

The sense amplifier equalizing signal SAEQ is outputted to the sense amplifiers SA constituting the sense amplifier group SAG, as illustrated in FIG. 29. FIG. 29 is a circuit diagram of the sense amplifier SA.

The sense amplifier SA comprises: (1) a circuit for receiving a data line equalizing signal DLEQ to equalize the potentials of data lines DL and /DL which receive data from the memory cell MC shown in FIG. 2; (2) a circuit responsive to a data line isolating signal DLI for determining which one of the two sub-arrays on opposite sides of the sense amplifier group SAG in the column direction as illustrated in FIG. 1 is to be selected; (3) a first sense amplifier portion including PMOS transistors for amplifying the potential difference between the data lines DL and /DL in response to a PMOS sense amplifier enable signal PSAE; (4) a second sense amplifier portion including NMOS transistors for amplifying the potential difference between the data lines DL and /DL in response to an NMOS sense amplifier enable signal NSAE; and (5) a circuit responsive to the sense amplifier equalizing signal SAEQ for equalizing the potentials of the data lines DL and /DL subjected to the potential difference amplification by the first and second sense amplifier portions.

The sense amplifier equalizing signal SAEQ outputted from the sense amplifier control circuit SACTL shown in FIG. 28 is controlled independently for each bank BANK illustrated in FIG. 27. Thus, the sense amplifier equalizing signal SAEQ may independently control the sense amplifiers SA illustrated in FIG. 29 for each bank BANK. The sense amplifier equalizing signal SAEQ is generated in response to the bank latch enable signal BLE and bank latch reset signal BLR for controlling the bank latches BL shown in FIG. 1, achieving synchronization between the bank latches BL and the sense amplifiers SA.

The structure of the sense amplifier control circuit SACTL is not limited to that illustrated in FIG. 28 but may be that illustrated in FIG. 4 or 10. FIGS. 30 and 31 are circuit diagrams of the sense amplifier control circuit SACTL implemented by the structures shown in FIGS. 4 and 10, respectively.

The sense amplifier control circuit SACTL for generating the sense amplifier equalizing signal SAEQ is illustrated in FIGS. 28, 30 and 31. However, a signal for controlling the sense amplifier of FIG. 29 except the sense amplifier equalizing signal SAEQ may be generated from a circuit structure similar to the sense amplifier control circuit SACTL. An example of this circuit structure is illustrated in FIG. 32.

Figure 32:
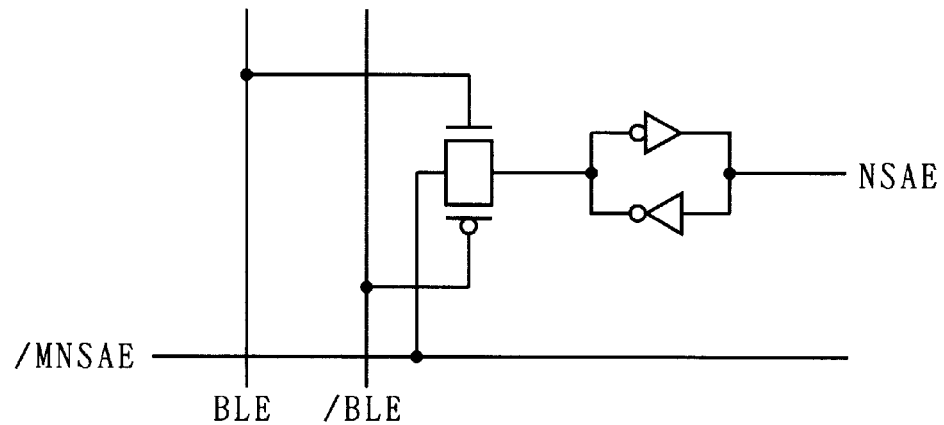
FIG. 32 is a circuit diagram of a fourth example of the architecture of the memory device according to the ninth preferred embodiment of the present invention.

FIG. 32 is a circuit diagram of a circuit for generating the NMOS sense amplifier enable signal NSAE using the structure of FIG. 31. A master NMOS sense amplifier enable signal /MNSAE is generated in a manner similar to the global sense amplifier equalizing signal /GSAEQ of FIG. 31. The same holds true for the data line equalizing signal DLEQ, the data line isolating signal DLI, and the PMOS sense amplifier enable signal PSAE illustrated in FIG. 29.

The above described signals for controlling the sense amplifiers SA generated independently for each bank BANK independently control the sense amplifiers SA for each bank BANK. The word lines WL are activated independently for each bank BANK in a substantial manner as illustrated in FIG. 1.

It is apparent from the above description that the circuits for generating the signals which control the sense amplifiers SA may be of the same construction (e.g., FIGS. 31 and 32). Each of the generation circuits formed using the structures shown in FIGS. 31 and 32 comprises a transmission gate for operating in response to the bank latch enable signals BLE and /BLE, and a looped latch including two inverters. The duplication of the circuits results in the increased circuit area. To prevent the increase in circuit area, the transmission gate and the latch are shared between the generation circuits to generate the plurality of signals which control the sense amplifiers SA.

Figure 33:
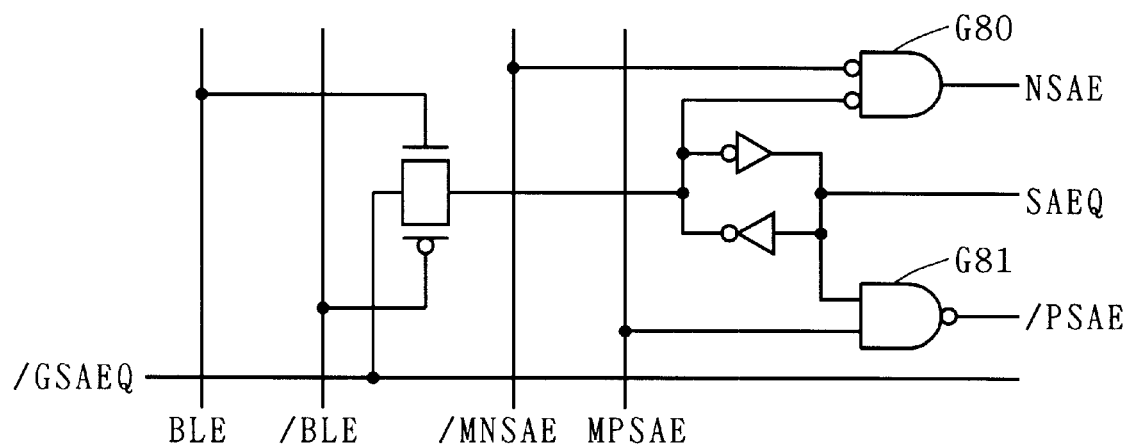
FIG. 33 is a circuit diagram of a fifth example of the architecture of the memory device according to the ninth preferred embodiment of the present invention.

FIG. 33 is a circuit diagram of a circuit including the single transmission gate and the single latch for generating the plurality of signals which control the sense amplifiers SA. The circuit of FIG. 33 is constructed such that gate elements G80 and G81 are added to the circuit of FIG. 31.

The gate element G80 has a first input terminal connected to a node of the looped latch which is closer to the transmission gate, and a second input terminal for receiving the master NMOS sense amplifier enable signal /MNSAE. The gate element G80 constructed as above described activates the NMOS sense amplifier enable signal NSAE only when the looped latch and the master NMOS sense amplifier enable signal /MNSAE are both active.

The gate element G81 is a NAND gate having a first input terminal connected to a node of the looped latch which outputs the sense amplifier equalizing signal SAEQ, and a second input terminal for receiving a master PMOS sense amplifier enable signal MPSAE. Thus, the gate element G81 activates a PMOS sense amplifier enable signal /PSAE only when the looped latch and the master PMOS sense amplifier enable signal MPSAE are both active.

The independent generation of the global sense amplifier equalizing signal /GSAEQ, the master NMOS sense amplifier enable signal /MNSAE, and the master PMOS sense amplifier enable signal MPSAE allows the independent generation of the sense amplifier equalizing signal SAEQ, the NMOS sense amplifier enable signal NSAE, and the PMOS sense amplifier enable signal /PSAE even when the circuit is partially shared as shown in FIG. 33. The circuit area when the circuit is partially shared is less than that when the circuit shown in FIG. 31 is provided for each signal.

Figure 34:
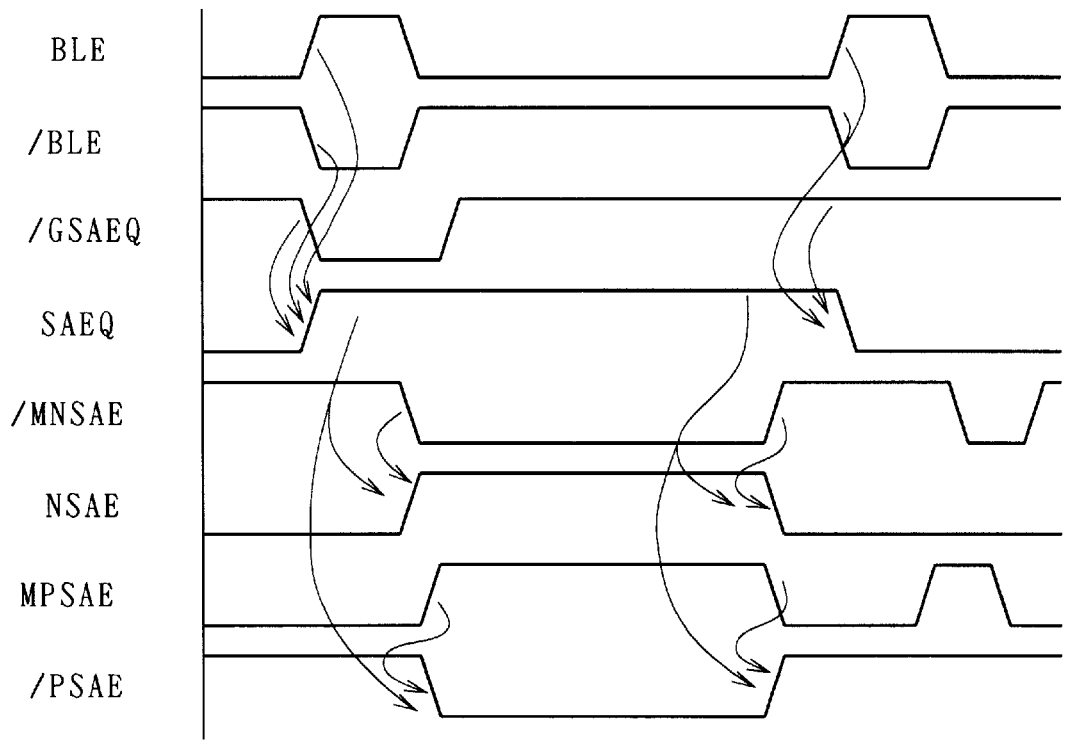
FIG. 34 shows waveforms of a timing chart of the memory device of FIG. 33.

FIG. 34 shows waveforms of a timing chart of the circuit illustrated in FIG. 33. The latch of FIG. 33 is activated in response to the activation of the bit line equalizing signals BLE, /BLE and the global sense amplifier equalizing signal /GSAEQ, and then the sense amplifier equalizing signal SAEQ directly outputted from the latch is activated. That is, the sense amplifier equalizing signal SAEQ should be referred to in order to examine whether or not the latch is active.

With the latch (sense amplifier equalizing signal SAEQ) being active, the activation/inactivation of the master NMOS sense amplifier enable signal /MNSAE and the master PMOS sense amplifier enable signal MPSAE determines the activation/inactivation of the NMOS sense amplifier enable signal NSAE and the PMOS sense amplifier enable signal /PSAE, respectively.

The global sense amplifier equalizing signal /GSAEQ which is inactive when the bit line equalizing signals BLE, /BLE are activated inactivates the latch and the sense amplifier equalizing signal SAEQ. When the master NMOS sense amplifier enable signal /MNSAE and the master PMOS sense amplifier enable signal MPSAE are active while the latch is inactive, the NMOS sense amplifier enable signal NSAE and the PMOS sense amplifier enable signal /PSAE remain inactive.

In the circuit illustrated in FIG. 33, the NMOS sense amplifier enable signal NSAE and the PMOS sense amplifier enable signal /PSAE are activated only when the latch is active. However, changing the connections of a respective one of the two input terminals of the gate elements G80 and G81 which is connected to the latch permits the NMOS sense amplifier enable signal NSAE and the PMOS sense amplifier enable signal /PSAE to be activated only when the latch is inactive. The connections which implement such a structure will be described below.

Figure 35:
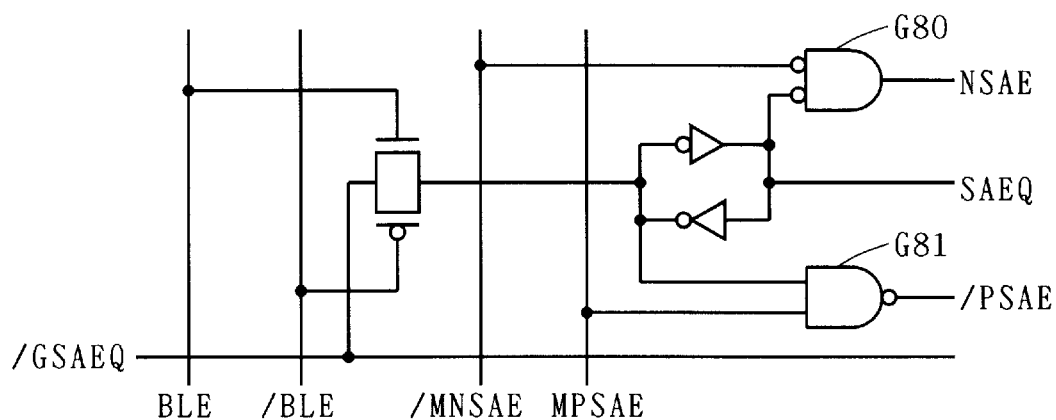
FIG. 35 is a circuit diagram of a sixth example of the architecture of the memory device according to the ninth preferred embodiment of the present invention.
Figure 36:
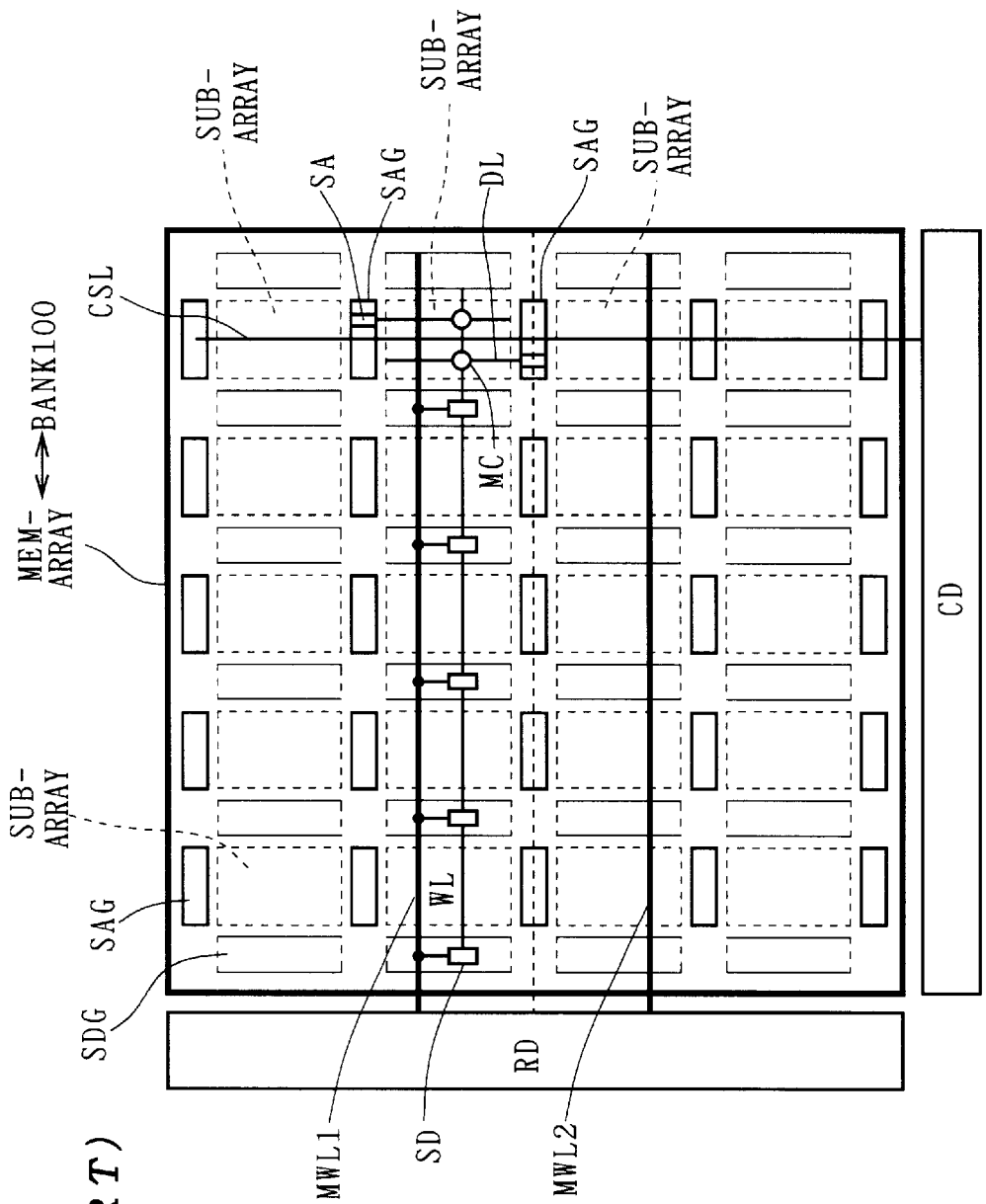
FIGS. 36 and 37 are circuit diagrams of a background art memory device architecture.

FIG. 35 is a circuit diagram wherein connections of the respective input terminals of the gate elements G80 and G81 are different from those shown in FIG. 33. The first input terminal of the gate element G80 is connected to one of the two nodes of the latch which outputs the sense amplifier equalizing signal SAEQ. The first input terminal of the gate element G81 is connected to one of the two nodes of the latch which is closer to the transmission gate.

While the invention has been described in detail, the foregoing description is in all aspects illustrative and not restrictive. It is understood that numerous other modifications and variations can be devised without departing from the scope of the invention.

We claim:

1. A memory device divided into a plurality of banks comprising:

a first-stage word line extending through the plurality of banks and selected in response to a row-address applied to a row decoder;

a plurality of latch circuits commonly connected to said first-stage word line and acting independently of each other;

second-stage word lines connected respectively to said plurality of latch circuits and activated independently of each other; and third-stage word lines selectively activated by sub-decoders connected to said second-stage word lines.

2. The memory device according to claim 1, wherein said first-stage word line includes a plurality of first-stage word lines, wherein said plurality of latch circuits are divided into groups arranged in a row direction with said second-stage word lines used as units, and wherein said plurality of latch circuits hold data in response to a holding signal, said holding signal being independent for each of said groups and common within each of said groups.

3. The memory device according to claim 2, wherein said plurality of latch circuits are reset in response to a reset signal, said reset signal being independent for each of said groups and common within each of said groups.

4. The memory device according to claim 2, wherein said plurality of latch circuits are reset in response to a reset signal for providing a "reset" instruction upon switch-on or reset.

5. The memory device according to claim 2, wherein said first-stage and second-stage word lines are comprised of the same metal interconnect layer.

6. The memory device according to claim 1, wherein said first-stage word line includes a plurality of first-stage word lines, wherein said plurality of latch circuits are divided into groups arranged in a row direction with said second-stage word lines used as units and are divided into blocks arranged in a column direction, and wherein a holding signal for instructing said plurality of latch circuits to hold data is activated independently for each of said groups and said blocks.

7. The memory device according to claim 1, wherein said plurality of latch circuits are arranged in parallel as viewed in said row direction and commonly connected to said first-stage word line.

8. The memory device according to claim 2, wherein data stored in a memory cell specified by said row-address is amplified by a sense amplifier, said memory device further comprising a sense amplifier control circuit for controlling said sense amplifier, said sense amplifier control circuit comprising:

a switching portion for changing a conducting/non-conducting state of a first sense amplifier control enable signal in response to said holding signal; and a latch portion for holding a logic of said first sense amplifier control enable signal provided thereto through said switching portion, said latch portion having a first output terminal for providing a first sense amplifier control signal for controlling said sense amplifier.

9. The memory device according to claim 8, wherein said first sense amplifier control signal is inactivated in response to a reset signal for instructing said plurality of latch circuits to be reset.

10. The memory device according to claim 8, wherein said latch portion has a second output terminal for outputting a signal in response to said logic of said first sense amplifier control enable signal held therein, and wherein said sense amplifier control circuit further comprises:

a gate element for determining whether a second sense amplifier control signal to be outputted therefrom is active or inactive in response to a second sense amplifier control enable signal applied thereto and said signal from said second output terminal of said latch portion.

11. A sense amplifier control device comprising:

a switching portion for changing a conducting/non-conducting state of a first sense amplifier control enable signal in response to a switching signal; and a latch portion for holding a logic of said first sense amplifier control enable signal provided thereto through said switching portion, said latch portion having a first output terminal for providing a first sense amplifier control signal for controlling a sense amplifier for amplifying memory cell data.

12. The sense amplifier control device according to claim 11, wherein said latch portion has a second output terminal for outputting a signal in response to said logic of said first sense amplifier control enable signal held therein, said sense amplifier control device further comprising:

a gate element for determining whether a second sense amplifier control signal to be outputted therefrom is active or inactive in response to a second sense amplifier control enable signal applied thereto and said signal from said second output terminal of said latch portion.

* * * * *